United States Patent
Venkataramani et al.

(10) Patent No.: US 10,114,917 B1
(45) Date of Patent: Oct. 30, 2018

(54) SYSTEMS AND METHODS FOR MAPPING EXECUTABLE MODELS TO PROGRAMMABLE LOGIC DEVICE RESOURCES

(71) Applicant: The MathWorks, Inc., Natick, MA (US)

(72) Inventors: Girish Venkataramani, Cambridge, MA (US); Purshottam Vishwakarma, Ashland, MA (US); Rama Kokku, Natick, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 15/225,193

(22) Filed: Aug. 1, 2016

(51) Int. Cl.
*G06F 17/50* (2006.01)

(52) U.S. Cl.
CPC ........ *G06F 17/505* (2013.01); *G06F 17/5054* (2013.01)

(58) Field of Classification Search
USPC ...................................................... 716/104
See application file for complete search history.

(56) References Cited

U.S. PATENT DOCUMENTS

| | | | |
|---|---|---|---|
| 7,844,653 B2 | 11/2010 | Simkins et al. | |
| 7,900,188 B2 | 3/2011 | Costa et al. | |
| 8,141,011 B1 | 3/2012 | Zhao et al. | |
| 8,352,505 B1 | 1/2013 | Venkataramani et al. | |
| 8,694,947 B1 | 4/2014 | Venkataramani et al. | |
| 8,745,557 B1 | 6/2014 | Venkataramani et al. | |
| 8,881,097 B2 | 11/2014 | Raghavan et al. | |
| 8,984,496 B2 | 3/2015 | Devane et al. | |
| 8,990,739 B2 | 3/2015 | Gu et al. | |
| 9,147,023 B1 | 9/2015 | Chen et al. | |
| 9,298,862 B1 | 3/2016 | Venkataramani et al. | |
| 9,436,441 B1 | 9/2016 | Venkataramani | |
| 9,454,627 B1 | 9/2016 | Venkataramani et al. | |
| 9,740,529 B1 | 8/2017 | Shei et al. | |
| 9,779,195 B2 | 10/2017 | Gu et al. | |
| 9,817,931 B1 | 11/2017 | Gu et al. | |
| 9,846,571 B1 | 12/2017 | Venkataramani et al. | |
| 2004/0250231 A1* | 12/2004 | Killian ................ G06F 17/5045 716/102 |

(Continued)

OTHER PUBLICATIONS

"7 Series DSP48E1 Slice: User Guide," UG479 (v1.8), Xilinx, Inc., Nov. 10, 2014, pp. 1-58.

(Continued)

*Primary Examiner* — Mohammed Alam
(74) *Attorney, Agent, or Firm* — Cesari and McKenna, LLP; Michael R. Reinemann

(57) ABSTRACT

Systems and methods automatically generate code from an executable model. The code may be generated from one or more in-memory representations constructed for the model. The in-memory representations may be analyzed, and portions that can be mapped to DSP slices of a programmable logic device may be identified. The portions may be modified based on information for a particular programmable logic device, such as the structure of the device's DSP slices. The modifications may ensure that elements of the generated code get mapped to DSP slices, when the generated code is used to synthesize the programmable logic device.

24 Claims, 28 Drawing Sheets

(56) References Cited

U.S. PATENT DOCUMENTS

| | | | |
|---|---|---|---|
| 2005/0144211 A1* | 6/2005 | Simkins | H03K 19/17732 708/490 |
| 2007/0186205 A1* | 8/2007 | Yu | G06F 17/5045 716/102 |
| 2013/0139122 A1* | 5/2013 | Pell | G06F 17/505 716/117 |
| 2015/0121319 A1 | 4/2015 | Hutton et al. | |
| 2015/0234968 A1 | 8/2015 | Boersma et al. | |
| 2016/0092215 A1* | 3/2016 | Fletcher | G06F 9/3001 712/22 |

OTHER PUBLICATIONS

Bagni, Daniele, "DSP Design Using Matlab and Simulink with Xilinx Targeted Design Platform," MathWorks and Xilinx joint Seminar, Xilinx, The MathWorks, Inc., Vialab, Sep. 15, 2011, pp. 1-84.

De Dinechin, Florent, et al., "Pipelined FPGA Adders," LIP, Arenaire, Apr. 2010, pp. 1-14.

"DSP Blocks in Stratix & Stratix GX Devices," Chapter 6, Stratix Device Handbook, vol. 2, Altera Corporation, Jul. 2005, pp. 1-28.

"DSP: Designing for Optimal Results: High-Performance DSP Using Virtex-4 FPGAs," DSP Solutions-Advanced Design Guide, Edition 1.0, Xilinx, Inc., Mar. 2005, pp. 1-116.

"Enabling High-Performance DSP Applications with Stratix V Variable-Precision DSP Blocks," White Paper, WP-01131-1, Ver. 1.1, Altera Corporation, May 2011, pp. 1-11.

"HDL Coder™: User's Guide," R2016a, The MathWorks, Inc., Mar. 2016, pp. 1-1264.

"LogiCORE IP DSP48 Macro v2.0," Product Specification, DS754, Xilinx, Inc., Mar. 1, 2011, pp. 1-17.

"System Generator for DSP: Reference Guide," UG638 (v 14.3), Xilinx, Inc., Oct. 16, 2012, pp. 1-626.

"Pipelining to Optimize FPGA VIs (FPGA Module)," LabVIEW 2010 FPGA Module Help, National Instruments, <http://zone.ni.com/reference/en-XX/help/371599J-01/lvfpgaconcepts/fpga_pipelining/>, Retrieved on Dec. 28, 2015, Edition date: Jun. 2010, pp. 1-5.

* cited by examiner

SYSTEMS AND METHODS FOR MAPPING EXECUTABLE MODELS TO PROGRAMMABLE LOGIC DEVICE RESOURCES

A portion of the disclosure of this patent document contains material that is subject to copyright protection. The copyright owner has no objection to facsimile reproduction by anyone of the patent document for the patent disclosure, as it appears in the United States Patent and Trademark Office patent file or records, but otherwise reserves all copyright rights whatsoever. Copyright © 2015 The Math-Works, Inc.

Applicant submits herewith Computer Program Listings, which are included as Appendix A attached hereto.

BRIEF DESCRIPTION OF THE DRAWINGS

The description below refers to the accompanying drawings, of which.

DETAILED DESCRIPTION OF ILLUSTRATIVE EMBODIMENTS

Electronic devices, such as consumer electronics and appliances, often include programmable logic devices, such as Field Programmable Gate Arrays (FPGAs), configured to perform various operations. FPGAs are also used in controllers, such as anti-lock brake controllers and engine control units, used in automobiles, and flight controllers used in airplanes. Because their functionality can be changed or upgraded after manufacture, FPGAs are a popular design choice of system designers.

FPGAs typically include large numbers of Configurable Logic Blocks (CLBs) that can be configured to perform a wide range of operations. For example, CLBs can be configured as lookup tables in order to perform various logic and/or mathematical operations. As FPGAs have become increasingly used to perform digital signal processing (DSP) operations, FPGA vendors have created FPGA architectures that include specialized programmable logic blocks in addition to CLBs. Because many DSP operations involve a multiply followed by an add, these specialized programmable logic blocks, known as DSP slices or DSP blocks, depending on device vendor, typically include one or more hard multipliers, one or more hard adders/subtractors, one or more hard accumulators, and one or more pipeline registers. Pipeline registers are typically used to isolate signals between the stages of a pipeline. The multipliers, adders and subtractors may be combinatorial circuits, while the accumulators may be adders with feedback that include registers. DSP slices may also include other elements, such as muxes, demuxes, and registers. The FPGAs may also include memory blocks, such as RAM blocks, and the DSP slices may be connected to the RAM blocks through high-speed interconnects. FPGAs may also include clocks and Input/Output (I/O) blocks.

The performance of an FPGA may be limited by its clock speed. DSP slices, however, are capable of performing operations faster than equivalent circuits formed from the FPGA's CLBs. Accordingly, configuring the DSP slices of an FPGA to perform DSP operations, as opposed to using CLBs, can result in faster operation. Additionally, two or more DSP slices may be organized into a tile to support cascading operations.

Figure 1:
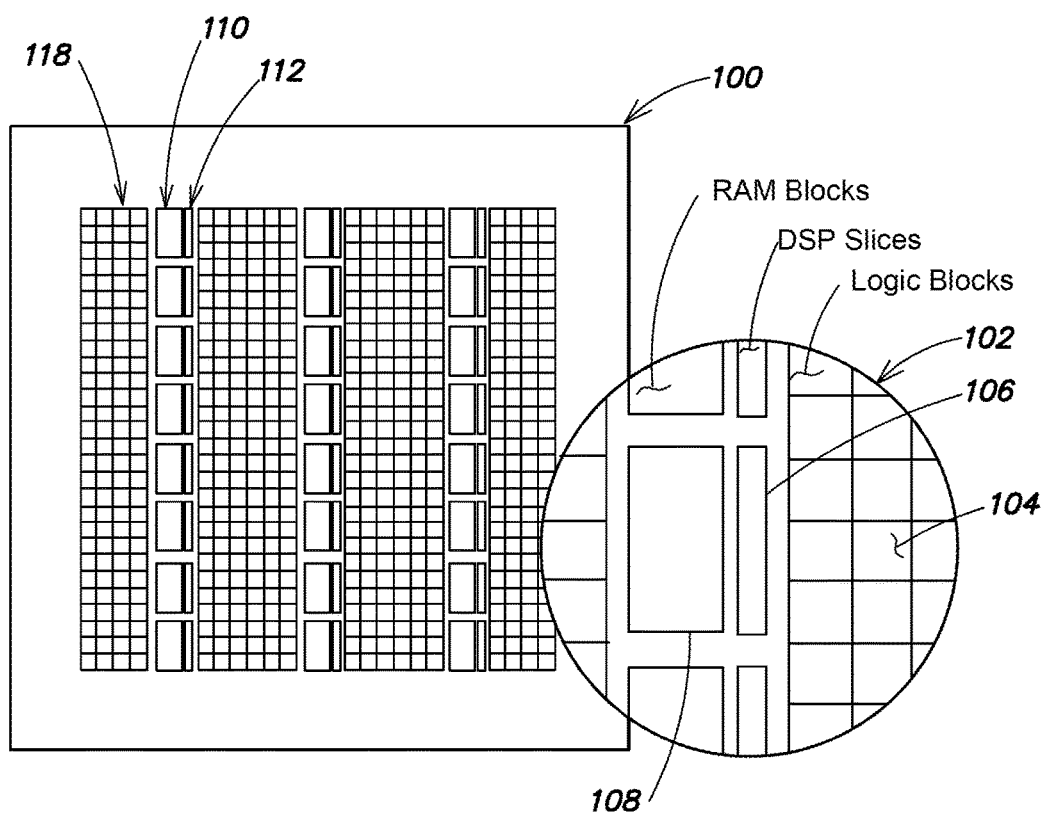
FIG. 1 is a schematic illustration of an example programmable logic device.

FIG. 1 is a schematic illustration of an example FPGA 100. As shown in the expanded portion 102, the FPGA 100 includes Configurable Logic Blocks (CLBs) 104, DSP slices 106, and RAM blocks 108. The RAM blocks 108 and DSP slices 106 may be organized in adjacent columns 110 and 112, respectively, of the FPGA 100. The columns 110 and 112 may be separated by regions 118 of CLBs 104.

Figure 2:
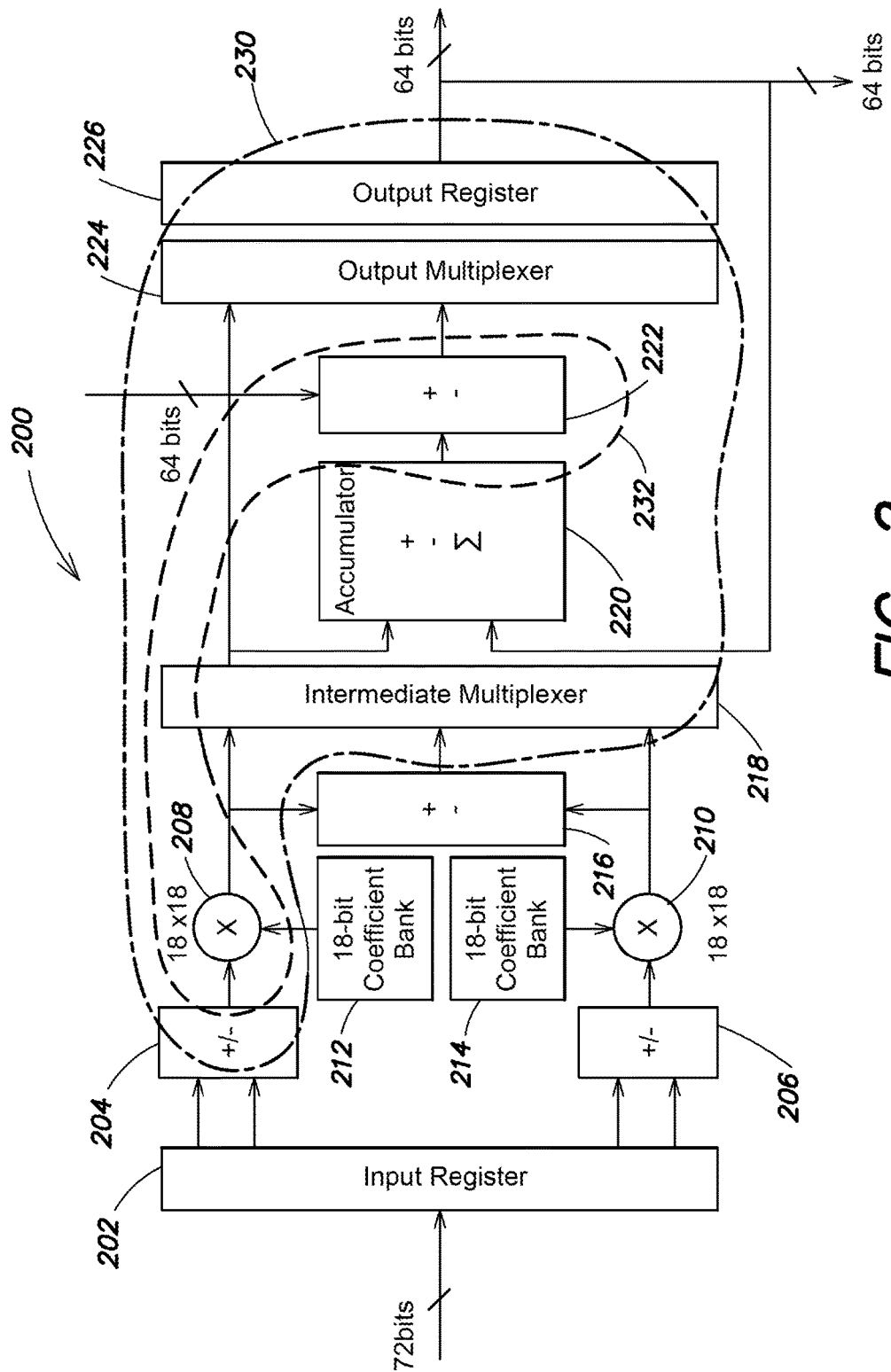
FIG. 2 is a schematic illustration of a DSP block of a Stratix V Field Programmable Gate Array from Altera Corporation.

FIG. 2 is a schematic illustration of an 18-bit precision mode DSP block 200 used in the Stratix V family of FPGAs from Altera Corporation of San Jose, Calif. The DSP block 200 includes an input register 202, two pre-adders 204, 206, and two 18×18 bit multipliers 208, 210. The DSP block 200 further includes two 18-bit coefficient banks 212, 214 connected to the multipliers 208, 210. The DSP block 200 further includes additional elements including an adder 216, an intermediate multiplexer 218, an accumulator 220, an adder 222, an output multiplexer 224, and an output register 226.

Figure 3:
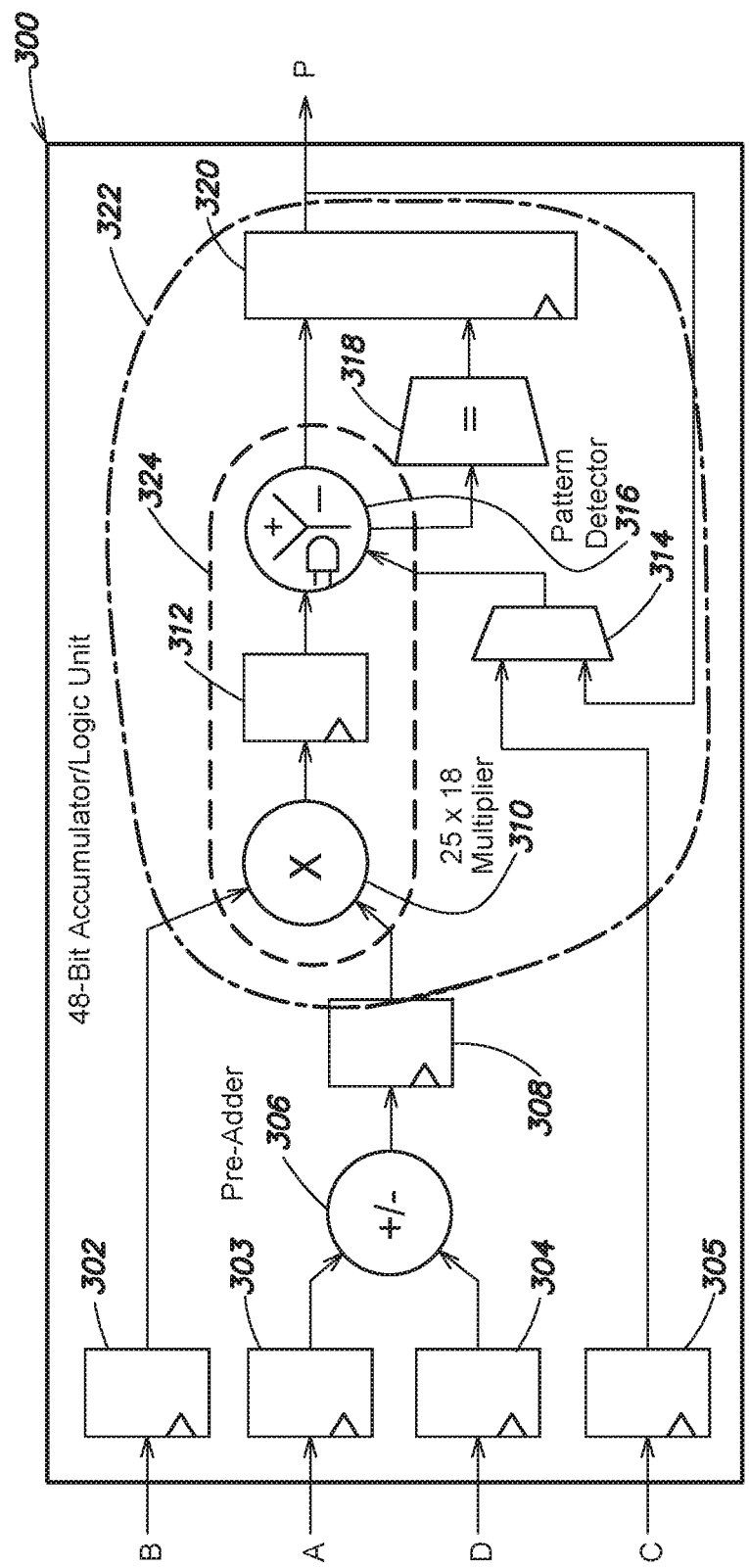
FIG. 3 is a schematic illustration of a DSP48E1 slice of a Xilinx, Inc. Field Programmable Gate Array.

FIG. 3 is a schematic illustration of a DSP48E1 slice 300 from Xilinx, Inc. of San Jose, Calif. The DSP48E1 slice 300 includes four inputs and one register 302-305 for each input, a pre-adder 306, another register 308, a 25×18 bit multiplier 310, and another register 312. The DSP48E1 slice 300 further includes a multiplexer 314, an Arithmetic Logic Unit (ALU) 316, a pattern detector unit 318, which may be used to perform an equality check, and an output register 320.

As indicated in FIGS. 2 and 3, different FPGA manufacturers use different DSP slice architectures. For example, the DSP block 200 from Altera has two 18×18 fixed multipliers 208, 210, while the DSP48E1 slice 300 from Xilinx has one 25×18 fixed multiplier 310. The arrangement of registers and interconnects also may be different. Furthermore, a given FPGA manufacturer may use different DSP slice architectures in different FPGA product families or even within an FPGA product family.

It should be understood that FIGS. 2 and 3 are meant for illustrative purposes, and that DSP slices may have different architectures.

Engineers may use a high-level modeling tool to design a signal processing or other system. The model may include model elements that, during model execution, perform functions, including filtering, signal operation, signal management, transform, estimation, or other functions. The model may further include model elements that perform math operations, such as multiply, divide, subtract, and add. In addition, model elements that perform filtering, transform, or other high-level functions may themselves include model elements that perform math operations. A code generator may generate code for the model, and the code may be provided to a synthesis tool, which may use the generated code to configure a programmable logic device, such as an FPGA. While a model may include multipliers and adders, either as separate model elements or within other model elements, these multipliers and adders may or may not be implemented on DSP slices of the target FPGA, depending on attributes of the multipliers and adders, attributes of inputs to the multipliers and adders, the particular target FPGA and the particular synthesis tool.

A model element may represent, for example, continuous and/or discrete dynamic aspects of a system, such as, for example, integration, unit delay, algorithms (e.g., sum, product or lookup tables), and/or structural aspects (e.g., multiplexers, switches, signal or bus selectors). A modeling element may also represent one or more states and the block may include a state diagram model.

In some embodiments, the present disclosure relates to systems and methods for automatically generating code, such as Hardware Description Language (HDL) or other code, from an executable, high-level behavioral model, where the code is intentionally structured such that one or more portions of the code will be mapped to one or more DSP slices of a target FPGA device when the target FPGA device is synthesized using the generated code.

Figure 4A:
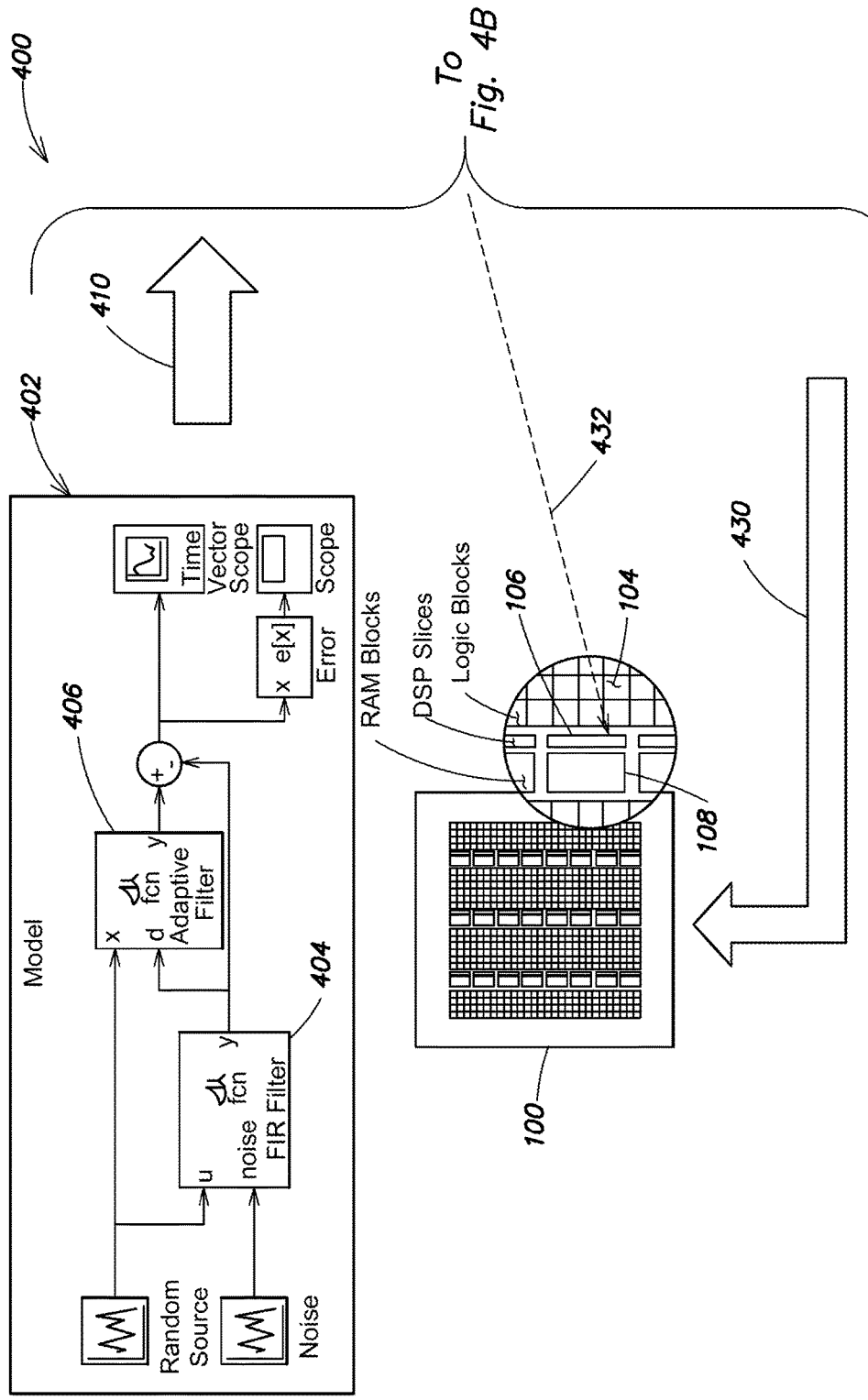
FIGS. 4A and 4B are partial views of a schematic illustration of an example work flow according to an embodiment of the disclosure.
Figure 4B:
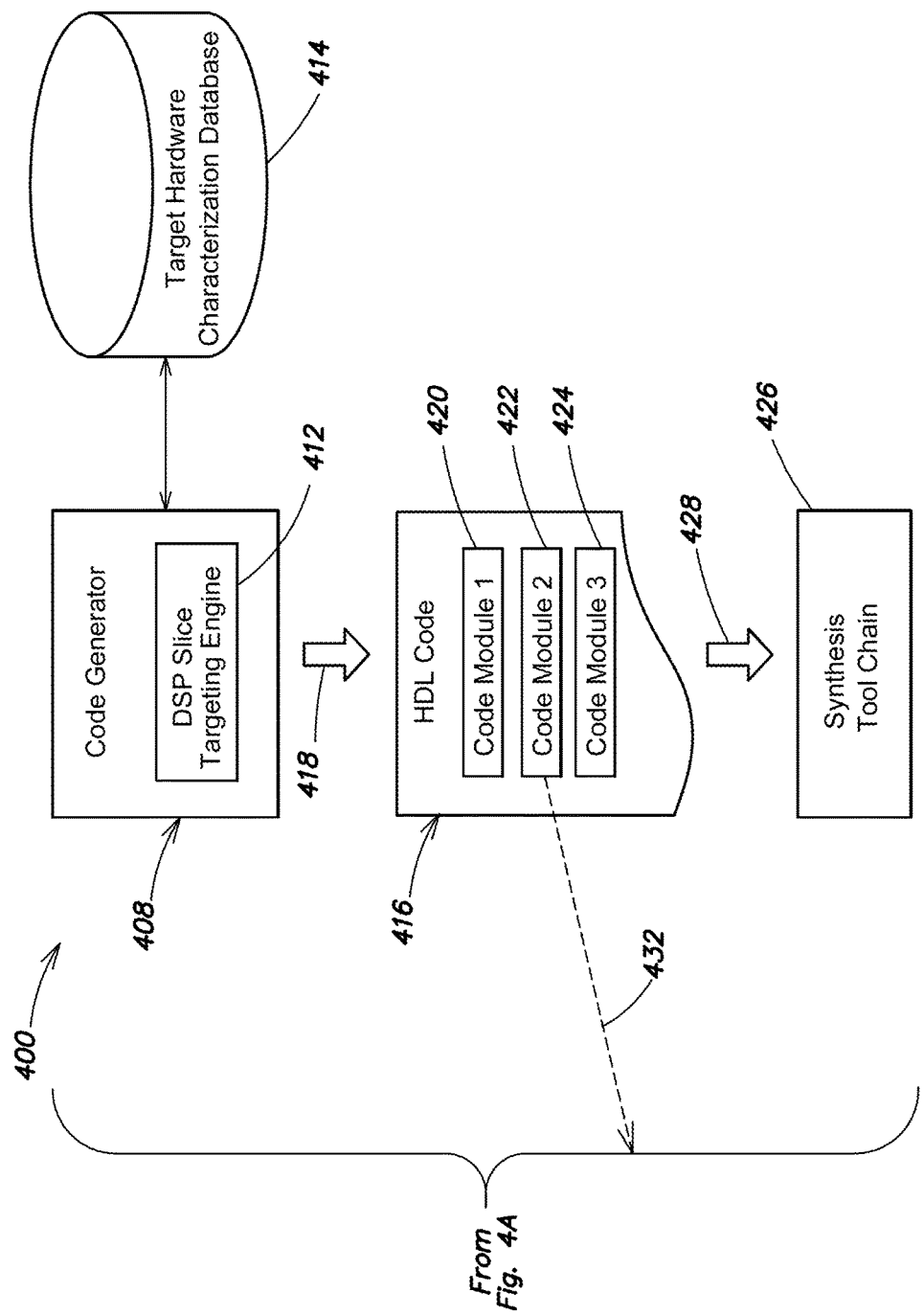

FIGS. 4A and 4B are partial views of a schematic illustration of a work flow 400 according to an embodiment of the disclosure. The work flow 400 includes a source model 402, which may be an executable graphical model. The model 402 may include a plurality of model elements, such as two filter elements (FIR Filter) 404 and (Adaptive Filter) 406. The work flow 400 may include a code generator 408 that accesses the model 402, as indicated by an arrow 410. The code generator 408 may include a DSP slice targeting engine 412, and may include or have access to a target hardware characterization database 414. The target hardware characterization database 414 may include information concerning particular FPGA devices, such as the architecture of the FPGA, the structure of the FPGA's DSP slices, e.g., Altera block 200 and Xilinx DSP48E1 slice 300, and unique programming attributes, if any, of the FPGA. The code generator 408 may automatically generate code 416, such as HDL code, for implementing the behavior of the model 402, as indicated by an arrow 418. The generated code 416 may include code modules, such as three code modules 420, 422, and 424. A synthesis tool chain 426 may perform hardware synthesis from the generated code 416, as indicated by an arrow 428, thus configuring an FPGA device, such as the FPGA device 100, as indicated by an arrow 430.

The synthesis tool chain 426 may place code elements described in the code 416 at selected elements of the FPGA 100. For example, the synthesis tool chain 426 may place code elements at particular CLBs 104, DSP slices 106, and RAM blocks 108 of the FPGA device 100.

When generating the code 416, the DSP slice targeting engine 412 of the code generator 408 may use knowledge of the structure of the DSP slices 106 of the target FPGA 100, as stored in and obtained from the target hardware characterization database 414. The DSP slice targeting engine 412 may use the retrieved information to generate one or more portions of the code 416 to map in a deterministic manner to one or more DSP slices 106 of the target FPGA device 100. For example, the model 402 may include model elements, such as Multiply-Accumulate (MAC) and Multiply-Add elements, one or more of which may be structured to map to one or more DSP slices or other hardware elements of a programmable logic device. Alternatively or additionally, the code generator may search for patterns of elements in the model 402, such as a multiplier followed by an adder and/or a dot multiply followed by a summation. These patterns of model elements may be mapped to one or more DSP slices or other hardware elements. In some implementations, a pattern of model elements may include noncontiguous model elements, e.g., model elements that are separated by one or more other elements that are not included in the pattern. Also, higher level elements, such as subsystems or components may be lowered to MAC, Multiply-Add, multiplier, and adder elements. The DSP slice targeting engine 412 may structure the code module 422 so that it maps to a DSP slice 106, as indicated by arrow 432. For example, the DSP slice targeting engine 412 may restructure, partition, combine, and/or replace elements of the model, such as multipliers, adders, subtractors, and accumulators, and may implement a pipeline depth, by adding one or more pipeline registers, to cause the multipliers, adders, subtractors, accumulators, and pipeline registers, when included in the generated code, to be mapped to one or more DSP slices 106 by the synthesis tool chain 426, during hardware synthesis.

For example, one or more pipeline registers may be added to achieve a pipeline depth that will cause model elements to be mapped deterministically to one or more DSP slices or other hardware elements. One or more pipeline registers may be added at the output of multipliers, gains, adders, Multiply-Add elements, and Multiply-Accumulate (MAC) elements. The pipeline registers may store signals or other data computed by one stage of a pipeline, and read by a next stage of the pipeline. The number of pipeline registers to be added to a model to achieve deterministic mapping of code generated for the model to one or more DSP slices or other hardware elements may be stored in the target hardware characterization database 414. In some implementations, the number of pipeline registers to be added at the output of an element may be a function of the word lengths (bitwidths) of the inputs to the multipliers, gains, adders, Multiply-Add elements, and Multiply-Accumulate (MAC) elements, whether the data types of the inputs are signed or unsigned, the target synthesis tool chain, the target programmable logic device, and the target clock frequency. Delays introduced in the model as a result of having added pipeline registers may be balanced, for example by inserting other registers in the model.

In some embodiments, model element types may be defined and included in a library of a modeling environment, and a user may choose to include instances of the model element types in a model constructed in the modeling environment. For a model to be implemented by a programmable logic device, the model elements may provide an abstraction layer that masks the details of different DSP slice architectures, such as the different architectures illustrated in FIGS. 2 and 3, from a user. The code generator 408 may analyze and/or restructure the model elements included in a model, depending on input word lengths, clock speed, selected synthesis tool chain, and selected programmable logic device. For example, the code generator 408 may add one or more pipeline registers, at specified locations, so that the model elements are mapped deterministically to one or more DSP slices or other hardware elements of the target programmable logic device. That is, a user may construct a model using the model elements, regardless of which synthesis tool chain and programmable logic device are to be utilized, and the code generator 408 may modify the model elements to deterministically map to DSP slices or other hardware elements of the targeted programmable logic device. A user may also choose elements of a model to be mapped to one or more DSP slices or other hardware elements.

Embedded Design and Development Environment

Figure 5A:
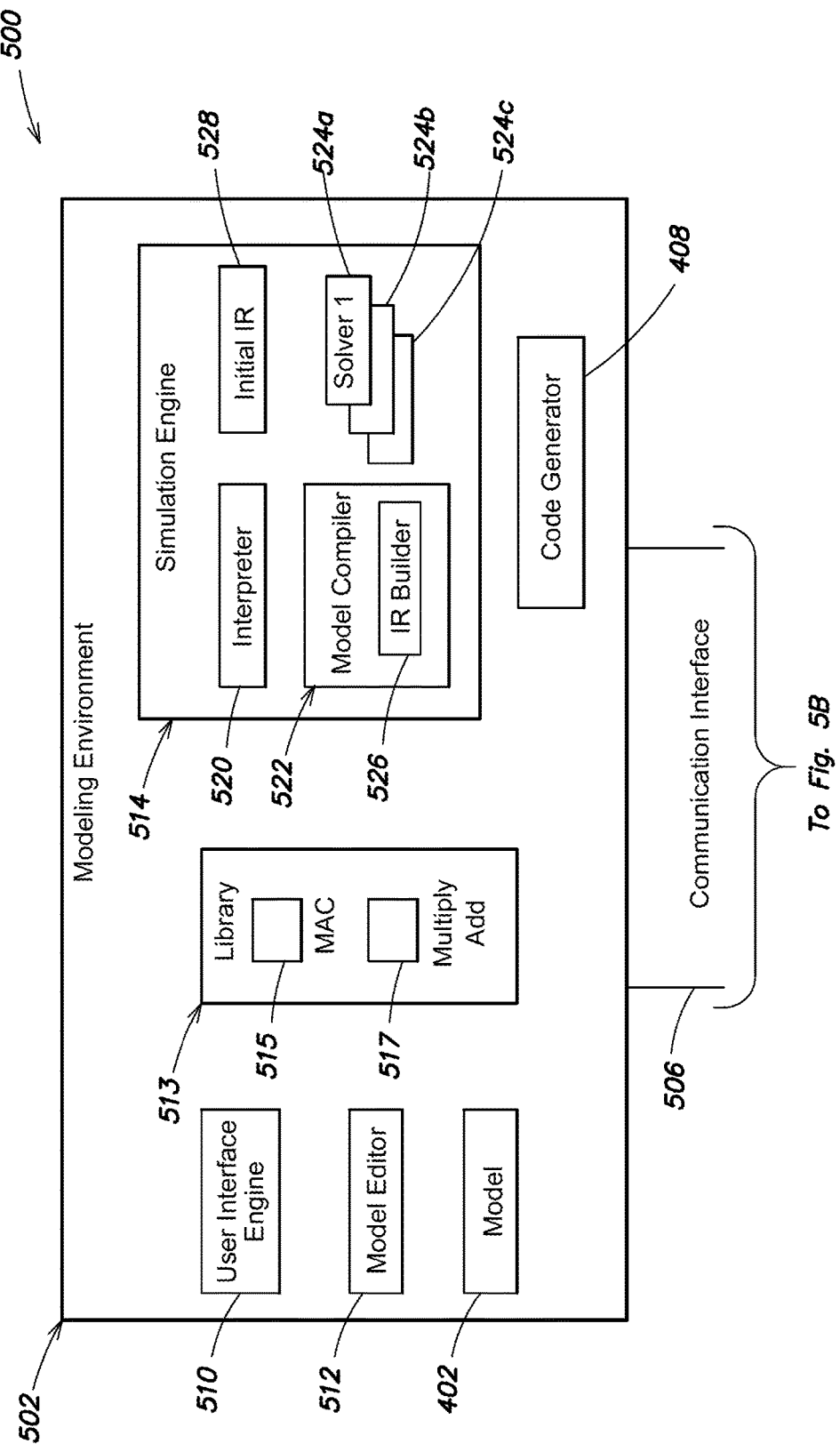
FIGS. 5A and 5B are partial views of a schematic illustration of an example embedded system design and development environment according to an embodiment of the disclosure.
Figure 5B:
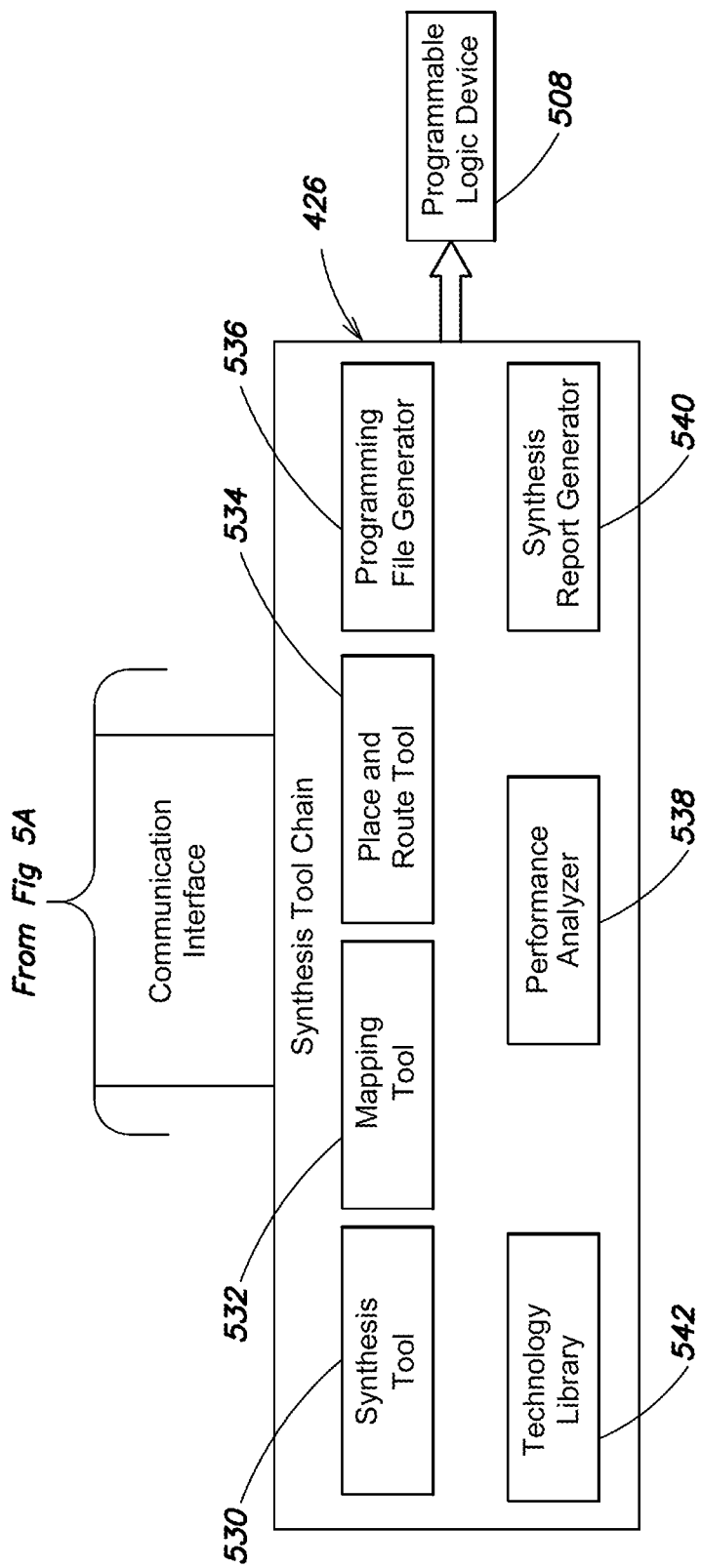

FIGS. 5A and 5B are partial views of a schematic diagram of an embedded system design and development environment 500 according to an embodiment of the disclosure. The environment 500 may include a modeling environment 502 and the synthesis tool chain 426. The modeling environment 502 and the synthesis tool chain 426 may be in communicating relationship through a communication interface 506, such as an Application Programming Interface (API), Remote Procedure Calls (PRCs), and/or Local Procedure Calls (LPCs), among other communication techniques. The synthesis tool chain 426 may synthesize a target programmable logic device 508, such as the FPGA device 100. In addition to being an FPGA, the target programmable logic device 508 may be an Application Specific Integrated Circuit (ASIC), a Field Programmable Gate Array (FPGA), a Complex Programmable Logic Device (CPLD), a System on a Chip (SoC), or other programmable hardware element.

The modeling environment 502 may include user interface (UI) engine 510, a model editor 512, a library 513, a simulation engine 514, and the code generator 408. The UI engine 510 may create and present one or more User Interfaces (UIs), such as Graphical User Interfaces (GUIs) and/or Command Line Interfaces (CLIs), on one or more display devices of a workstation or other data processing device. The one or more GUIs and/or CLIs may be operated by users to perform various modeling tasks, such as opening, creating, and saving models, such as the computer-generated, executable graphical model 402. The GUIs and/or CLIs may also be used to enter commands, set values for parameters and properties, run models, change model settings, etc. The model editor 512 may perform selected operations, such as open, create, edit, and save, in response to user inputs. The library 513 may include a plurality of model element types, and model elements of selected types may be added to a model during model creation or editing. In an embodiment, the library 513 includes two model element types: a Multiply-Accumulate (MAC) element type 515, and a Multiply-Add element type 517. The MAC element type 515 may receive two scalar, vector, or matrix inputs, a and b, and may implement the following function:

$$\Sigma a(i)*b(i)$$

where i indicates an index number. The Multiply-Add model element 517 may receive three inputs, a, b, and c, which may have scalar, vector, or matrix dimensions, and may implement the following function:

$$c+a.*b,$$

where .* represents element-wise multiplication of arrays. For example, for two arrays A and B, A.*B is the element-by-element product of A times B.

In some embodiments, where inputs a and b are scalars, the Multiply-Add model element may implement the function as $$c \pm a*b$$

The MAC element type 515 and the Multiply-Add element type are designed so that code, when generated for a model including these elements is generated, portions of the code can be mapped to one or more DSP slices of a programmable logic device. It should be understood that the library 513 may include other model element types, such as Gain, Constant, Multiply, etc., instances of which can be selected and included in a model.

The simulation engine 514 may include an interpreter 520, a model compiler 522, and one or more solvers, such as solvers 524a-c. The model compiler 520 may include an Intermediate Representation (IR) builder 526. The simulation engine 514 may generate execution instructions for the model 402, and execute, e.g., compile and run or interpret, the model 402, using one or more of the solvers 524a-c.

Exemplary solvers include one or more fixed-step continuous solvers, which may utilize integration techniques based on Euler's Method or Heun's Method, and one or more variable-step solvers, which may be based on the Runge-Kutta and Dormand-Prince pair.

The IR builder 526 may construct one or more in-memory representations or IRs for the model 402. In an embodiment, the IR builder 526 may construct an initial IR 528 that may closely correspond to the model 402, and may be utilized by the interpreter 520 to execute the model 402. For example, the structure of the initial IR 528 may closely correspond to the structure of the model 402, where model elements map one-to-one to nodes of the initial IR 528, and arrows or lines of the model map one-to-one to edges of the initial IR 528. The initial IR 528 also may include information for presenting a visual display of the model, for example, in the form of a block diagram model, on a display device of the workstation or data processing device.

The synthesis tool chain 426 may include a synthesis tool 530, a mapping tool 532, a place and route tool 534, a programming file generator 536, a performance analyzer 538, and a synthesis report generator 540. The synthesis tool chain 426 also may include a technology library 542.

In some embodiments, the modeling environment 502 is a high-level modeling environment. Suitable high-level modeling environments include the MATLAB® algorithm development environment and the Simulink® model-based design environment from The MathWorks, Inc., as well as the Simscape™ physical modeling system, the SimEvents® discrete event simulation tool, and the Stateflow® state chart tool also from The MathWorks, Inc., the MapleSim physical modeling and simulation tool from Waterloo Maple Inc. of Waterloo, Ontario, Canada, the LabVIEW virtual instrument programming system and the NI MatrixX model-based design product both from National Instruments Corp. of Austin, Tex., the Visual Engineering Environment (VEE) product from Agilent Technologies, Inc. of Santa Clara, Calif., the System Studio model-based signal processing algorithm design and analysis tool and the SPW signal processing algorithm tool from Synopsys, Inc. of Mountain View, Calif., a Unified Modeling Language (UML) system, a Systems Modeling Language (SysML) system, and the System Generator system from Xilinx, Inc. of San Jose, Calif. Models created in the high-level modeling environment may contain less implementation detail, and thus operate at a higher level than certain programming languages, such as the C, C++, C#, and SystemC programming languages.

Those skilled in the art will understand that the MATLAB® algorithm development environment is a math-oriented, textual programming environment for digital signal processing (DSP) design, among other uses. The Simulink® model-based design environment is a modeling tool for modeling and simulating dynamic and other systems, among other uses. The MATLAB® and Simulink® environments provide a number of high-level features that facilitate algorithm development and exploration, and support model-based design. Exemplary high-level features include dynamic typing, array-based operations, data type inferencing, sample time inferencing, and execution order inferencing, among others.

In some embodiments, a lower level programming language relative to the high-level modeling environment 502, such as the C, C++, C#, and SystemC programming languages, among others, may be used to create one or more models.

Models constructed within the modeling environment 502 may include textual models, graphical models, such as block diagrams, state-based models, and combinations thereof. A given model may simulate, e.g., approximate the operation of, a system. Exemplary systems include weather systems, financial markets, plants, controllers, etc. A model may be executed in order to simulate the system being modeled, and the execution of a model may be referred to as simulating the model. For example, a GUI generated by the UI engine 510 and presented on a display may include a Run command button that may be selected by a user to execute the model 402. Alternatively, a user may enter a run command in a CLI generated by the UI engine 510. In response to the user selecting the Run button or entering the run command, the simulation engine 514 may execute the model 402, and may present the results of the model's execution to the user, e.g., on the display.

An executable model may be a time based block diagram. A time based block diagram may consist, for example, of model elements, such as blocks, connected by lines (e.g., connector lines) that can represent signal values or that can represent an algorithm. The model elements may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between model elements or to specify execution dependencies between model elements), variables (e.g., to specify information shared between model elements), physical connections (e.g., to specify electrical wires, pipes with volume flow, rigid mechanical connections, etc.), algorithms (e.g., to be applied to an input, an output, a value, etc.), or the like. The attributes may consist of meta information such as sample times, dimensions, complexity (e.g., whether there is an imaginary component to a value), data type, etc. associated with the model elements.

In a time based block diagram, ports may be associated with model elements. A relationship between two ports may be created by connecting a line (e.g., a connector line) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic or algebraic system (e.g., by buffering variable values, by summing all variables of a certain type to 0, or by equating all variables of a certain type). A port may be an input port, an output port, an enable port, a trigger port, a function-call port, a publish port, a subscribe port, an exception port, an error port, a physics port, an entity flow port, a data flow port, a control flow port, etc.

Relationships between model elements may be causal and/or non-causal. For example, a model may include a block that represents a continuous-time integration block that may be causally related to a data logging block by using a line (e.g., a connector line) to connect an output port of the continuous-time integration block to an input port of the data logging model element. Further, during execution of the model, the value stored by the continuous-time integrator may change as the current time of the execution progresses. The value of the state of the continuous-time integrator may be available on the output port and the connection with the input port of the data logging model element may make this value available to the data logging block.

In some implementations, a model element may include or otherwise correspond to a non-causal modeling function or operation. An example of a non-causal modeling function may include a function, operation, or equation that may be executed in different fashions depending on one or more inputs, circumstances, and/or conditions. Put another way, a non-causal modeling function or operation may include a function, operation, or equation that does not have a predetermined causality.

The GUI generated by the UI engine 510 also may include a Code Generation command button that may be selected by the user. Alternatively, the user may enter a code generation command in the CLI. In response to the user selecting the Code Generation button or entering the code generation command, the code generator 408 may generate code for at least a portion of the model 402.

Code Generator

Figure 6:
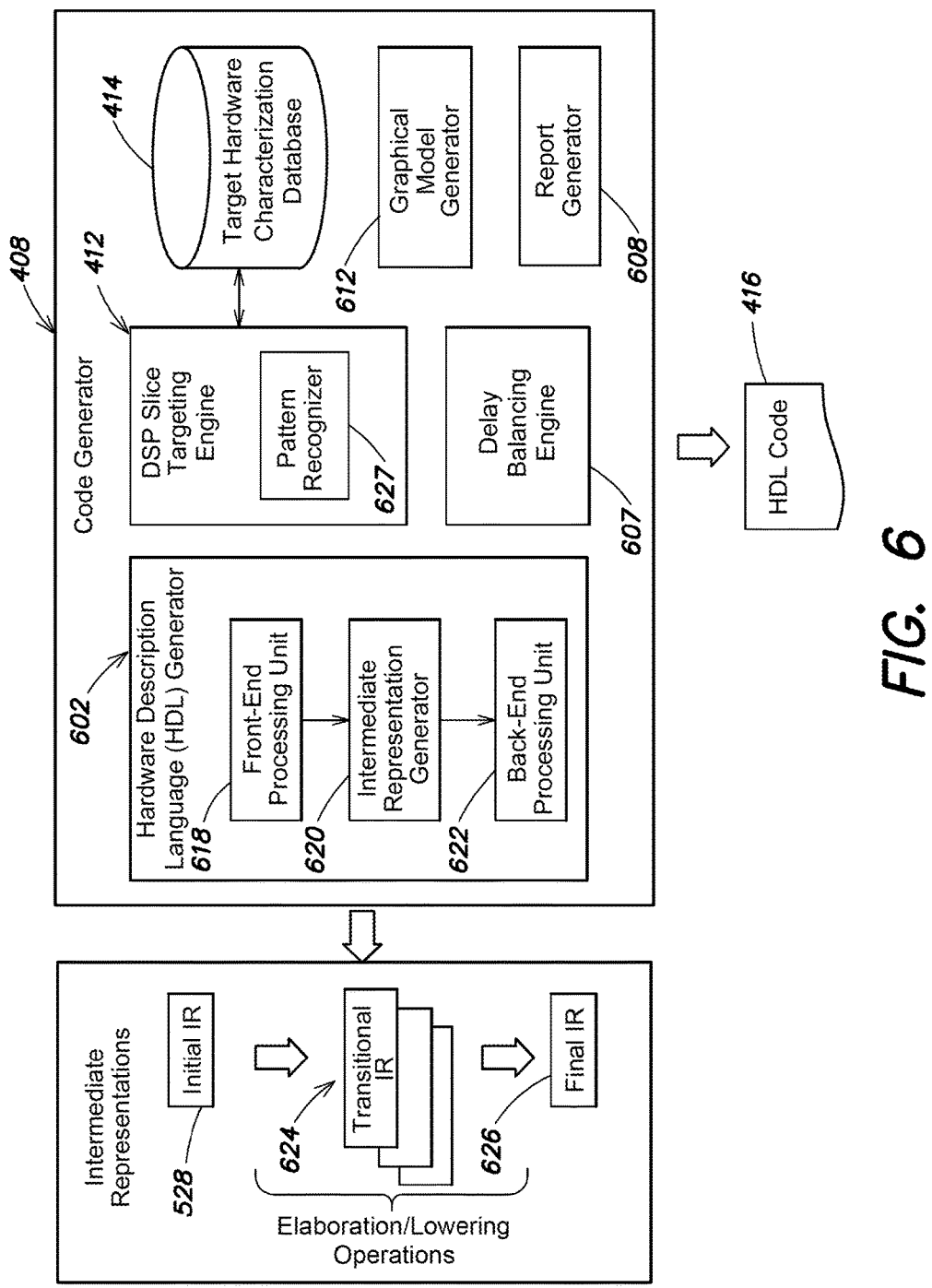
FIG. 6 is a schematic illustration of an example code generator in accordance with an embodiment of the disclosure.

FIG. 6 is a schematic illustration of the code generator 408 in accordance with an embodiment of the disclosure. The code generator 408 may include a hardware description language (HDL) generator 602, the DSP slice targeting engine 412, a delay balancing engine 607, a report generator 608, and a graphical model generator 612. As noted, the code generator 408 may include or have access to the target hardware characterization database 414. The HDL generator 602 may include a front-end processing unit 618, an intermediate representation (IR) generator 620, and a back-end processing unit 622. The DSP slice targeting engine 412 may include a pattern recognizer 627.

The IR generator 620 of the code generator 408 may be the same as the IR builder 526 of the model compiler 522, or it may be a different IR generator/builder. The IR generator 620 may construct or may receive the initial IR 528 for the model 402. For example, the code generator 408 may receive an initial IR from the model compiler 522 or from some other compiler. The IR generator 620 may apply one or more transforms, starting with the initial IR 528, resulting in the generation of a plurality of transitional IRs, indicated generally at 624, and ending with a final IR 626, from which code, such as HDL code 428 may be generated. The process of transforming the initial IR 528 through the transitional IRs 624 and to the final IR 626 may be referred to as elaboration or lowering.

The code generator 408 may access and operate upon the model 402 created or identified by the user. The model 402, which may be referred to as a source model, may be a high-level functional or behavioral model, such as a MATLAB model, Simulink model, a Stateflow chart, a LabVIEW block diagram, a VEE diagram, etc. The code generator 408 may produce the HDL code 416 corresponding to the model 402 that is bit true and cycle accurate (modulo a well-defined initial latency) to the simulation of the model 402. Exemplary HDL code generated by the code generator 408 include VHDL code, Verilog code, SystemC code, System Verilog code, embedded MATLAB code, vendor or target specific HDL code, such as Xilinx FPGA libraries, etc. The code generator 408 may generate other code, such as multiply-accumulate instructions for DSP processors.

In some embodiments, the code generator 408 may be implemented through one or more software modules or libraries containing program instructions and data structures pertaining to the methods described herein. The software modules may be stored in one or more memories, such as a main memory, a persistent memory and/or on computer readable media, of a workstation or other data processing machine or device, and executed by one or more processing elements, such as a general purpose processor, a central processing unit, etc. Other computer readable media may also be used to store and execute these program instructions, such as non-transitory computer readable media, including optical, magnetic, or magneto-optical media. In some embodiments, the code generator 408 may be implemented in hardware comprising registers and combinational logic configured and arranged to produce sequential logic circuits. In some embodiments, various combinations of software and hardware, including firmware, may be utilized to implement the disclosure.

The target hardware characterization database 414 may be implemented through one or more data structures, such as linked lists, tables, databases, etc. stored in memory.

It should be understood that FIGS. 5 and 6 are meant for illustrative purposes, and that the modeling environment 502, the code generator 408, and the synthesis tool chain 426 may be implemented in other ways. For example, the code generator 408, or one or more components thereof, may be separate from the modeling environment 502. In such cases, the code generator 408 may be in communication with the modeling environment 502 through local procedure calls (LPCs), remote procedure calls (RPCs), or one or more Application Programming Interfaces (APIs).

Suitable code generators for use with the present invention include, but are not limited to, the Simulink Coder™, the Embedded Coder®, and the HDL Coder™ products from The MathWorks, Inc. of Natick, Mass., and the TargetLink product from dSpace GmbH of Paderborn Germany. Nonetheless, other code generation systems and other compilers may be used.

Target Hardware Characterization Database

The system of the present disclosure may include a hardware characterization database builder. The hardware characterization database builder may be included in the code generator, or it may be a separate component. The hardware characterization database builder may provide design information, such as generated code, scripts, and Register Transfer Level (RTL) descriptions, to a synthesis tool chain for synthesizing a programmable logic device. The hardware characterization database builder may receive hardware implementation information generated by the synthesis tool chain concerning the synthesized programmable logic device. For example, the hardware characterization database builder may receive a utilization report containing information regarding timing, area usage, and power consumption of the synthesized programmable logic device. The hardware characterization database builder may analyze this information, and load the results of its analysis into the target hardware characterization database 414. The hardware characterization database builder may vary the design information provided to the synthesis tool chain in order to explore the effects of such changes on the timing, area usage, and power consumption of the programmable logic device. The variation in design information may be manually determined, and may define a design exploration loop.

Through such a design exploration loop, the hardware characterization database builder may determine how to structure generated code for a specified synthesis tool chain and programmable logic device so that the generated code is mapped to elements of the programmable logic device by the synthesis tool. For example, based on the data derived from the exploration loop, the hardware characterization database builder may determine the number of pipeline stages to include in generated code such that portions of the generated code are mapped to desired hardware elements, such as DSP slices, of the programmable logic device. For example, by structuring the generated code to include a number of pipeline stages, the generated code may be mapped to a plurality of cascaded DSP slices during hardware synthesis. The hardware characterization database builder may further determine the number of pipeline registers and their location in the generated code to achieve the specified number of pipeline stages, which may also be referred to as pipeline depth.

Figure 7:
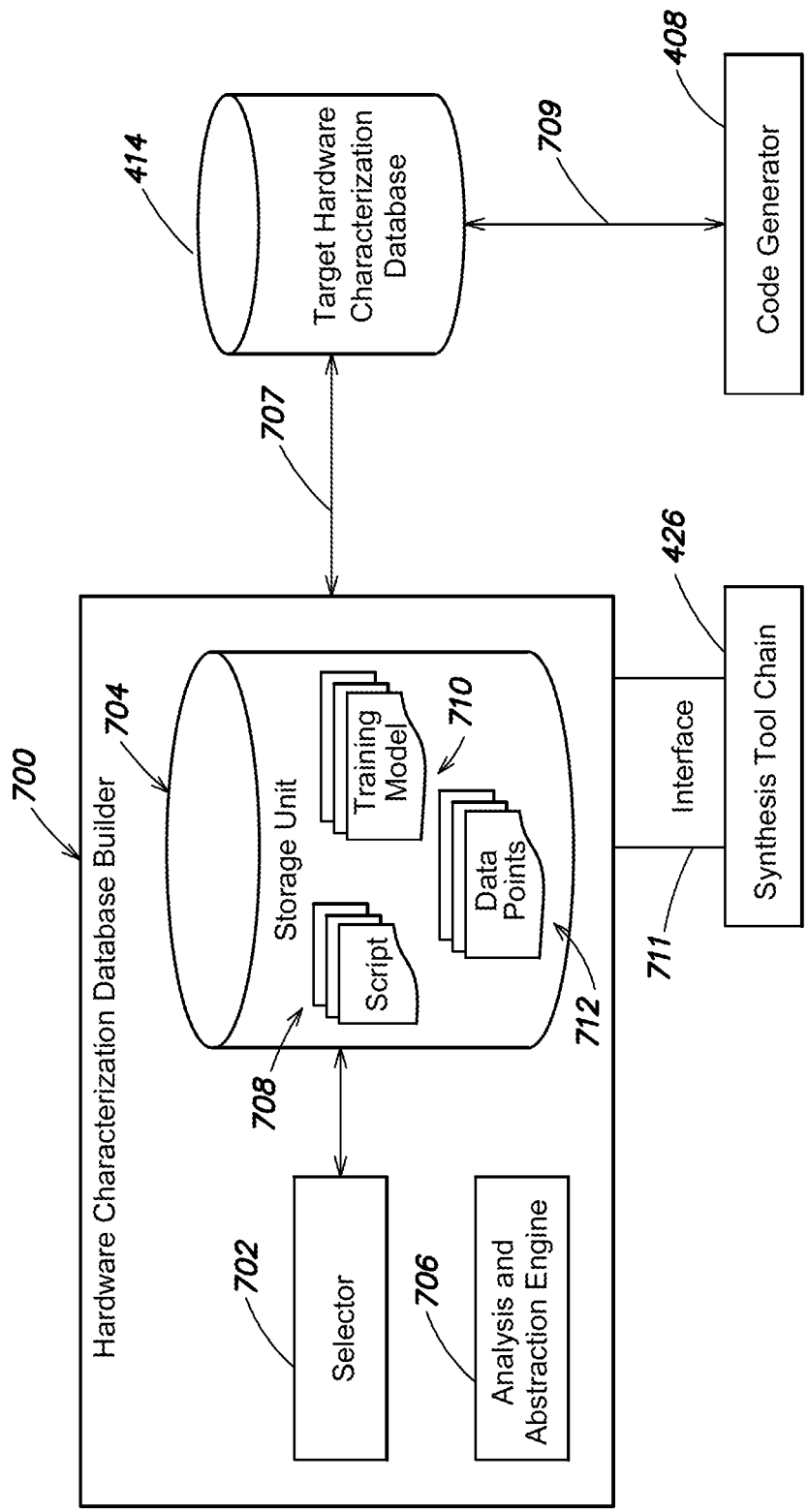
FIG. 7 is a schematic illustration of an example hardware characterization database builder in accordance with an embodiment of the disclosure.

FIG. 7 is a schematic illustration of a hardware characterization database builder 700. The hardware characterization database builder 700 may include a selector 702, a storage unit 704, and an analysis and abstraction engine 706. The hardware characterization database builder 700 may access the target hardware characterization database 414, as indicated by arrow 707 for example to load data into the target hardware characterization database 414. The code generator 408 may access data from the target hardware characterization database 414, as indicated by arrow 709. The hardware characterization database builder 700 may also communicate with one or more synthesis tool chains, such as the synthesis tool chain 426. In some implementations, the hardware characterization database builder 700 may include or provide an interface 711, which may be in the form of an Application Programming Interface (API).

The storage unit 704 may contain data that may be provided to the synthesis tool chain 426 and/or information from which such data may be generated by the hardware characterization database builder 700. In some implementations, the storage unit 704 may include one or more scripts, as indicated at 708, one or more training models, as indicated at 710, and one or more data point sets, as indicated at 712. The scripts 708 may be instructions that direct a synthesis tool chain to synthesize a programmable logic device. The scripts 708 may implement particular model element types of the modeling environment 502. For example, one script may cause the synthesis tool to implement a multiplier in the programmable logic device, another script may cause the synthesis tool to implement an adder in the programmable logic device, a further script may cause the synthesis tool to implement a switch in the programmable logic device, yet another script may cause the synthesis tool to implement a combination multiplier-adder in the programmable logic device, etc. In some implementations, the scripts 708 may be handwritten or automatically generated code, such as HDL code, that may be parameterizable in bitwidth and pipeline depth, for example by the data points 712. The training models 710 may be predefined executable models for which code may be generated, for example by the code generator 408. The generated code may be provided to the synthesis tool chain 426 for synthesizing a programmable logic device. The data points 712 may provide parameters for the scripts 708 and/or the training models 710. For example, one set of data points may specify a range or a sequence of input word lengths for a script that implements a multiplier. Another set of data points may specify a range of pipeline depths.

In some embodiments, the scripts may be written as Tool Command Language (tcl) code snippets, or in other languages. In addition, Register-Transfer Level (RTL) templates may be used to generate RTL script instances for different configuration parameters, e.g., parameters with different input word lengths, parameters with different pipeline depths, etc. The RTL templates may be stored in the storage unit 704. The training models 710, which may include a plurality of model elements arranged in a particular manner, may be executable model files and/or projects. The data points 712 may be stored as one or more data structures.

The scripts 708 and training models 710 may include constraints on timing, area, or power. In this way, the scripts 708 may direct the synthesis tool chain 426 to choose particular implementations of hardware components when performing synthesis based on the scripts. For example, if a script or training model imposes a timing constraint, the synthesis tool chain 426 may choose hardware components that might require more area, but that operate faster thus complying with the timing constraint. In some embodiments, the scripts and training models may include one or more synthesis directives, such as pragmas and attributes, in a format recognized by the synthesis tool chain 426. The synthesis directives may set options at the synthesis tool chain 426 and/or otherwise control or direct the synthesis process.

Figure 8A:
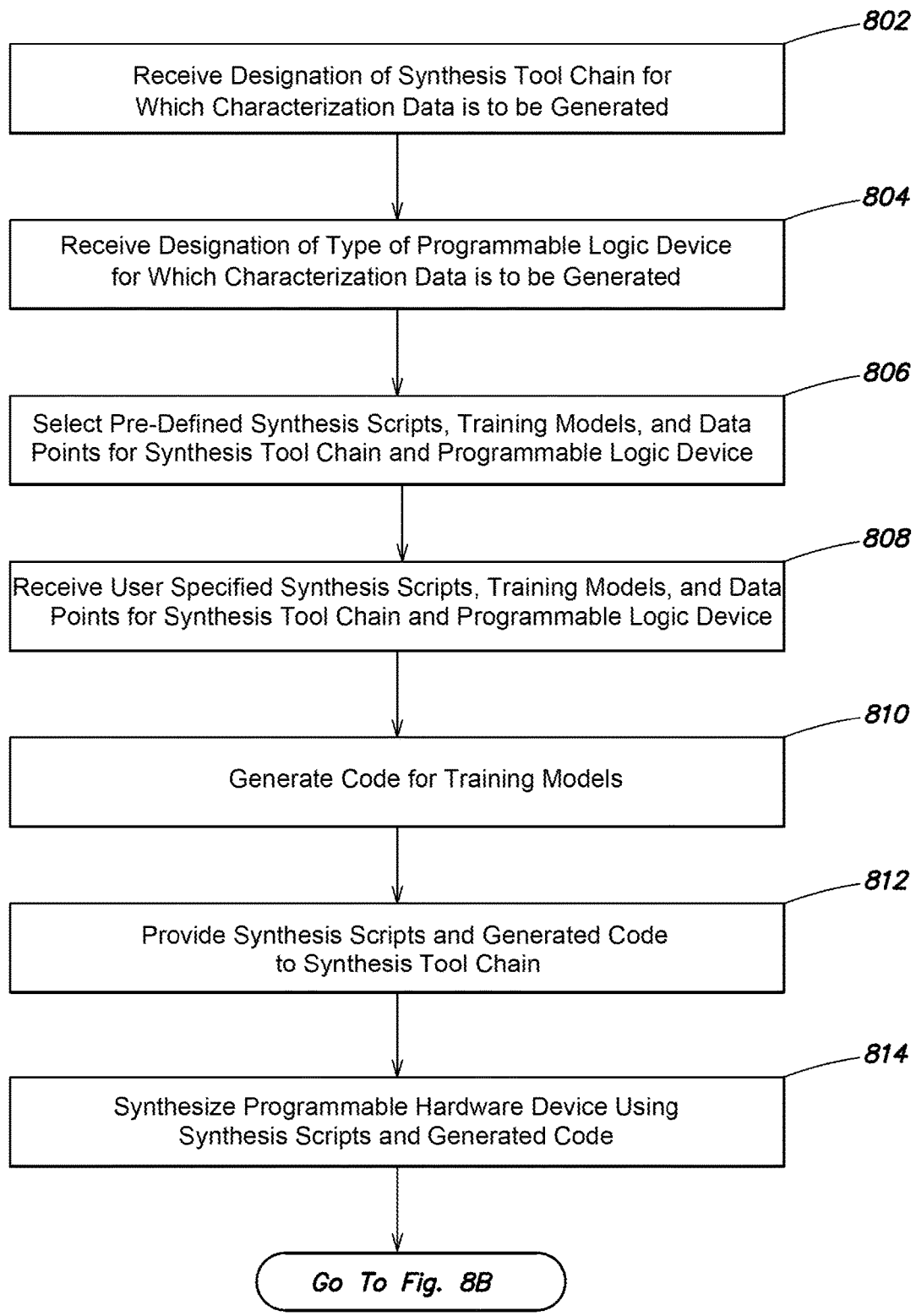
FIGS. 8A-8B are partial views of a flow diagram of an example method in accordance with an embodiment of the disclosure.
Figure 8B:
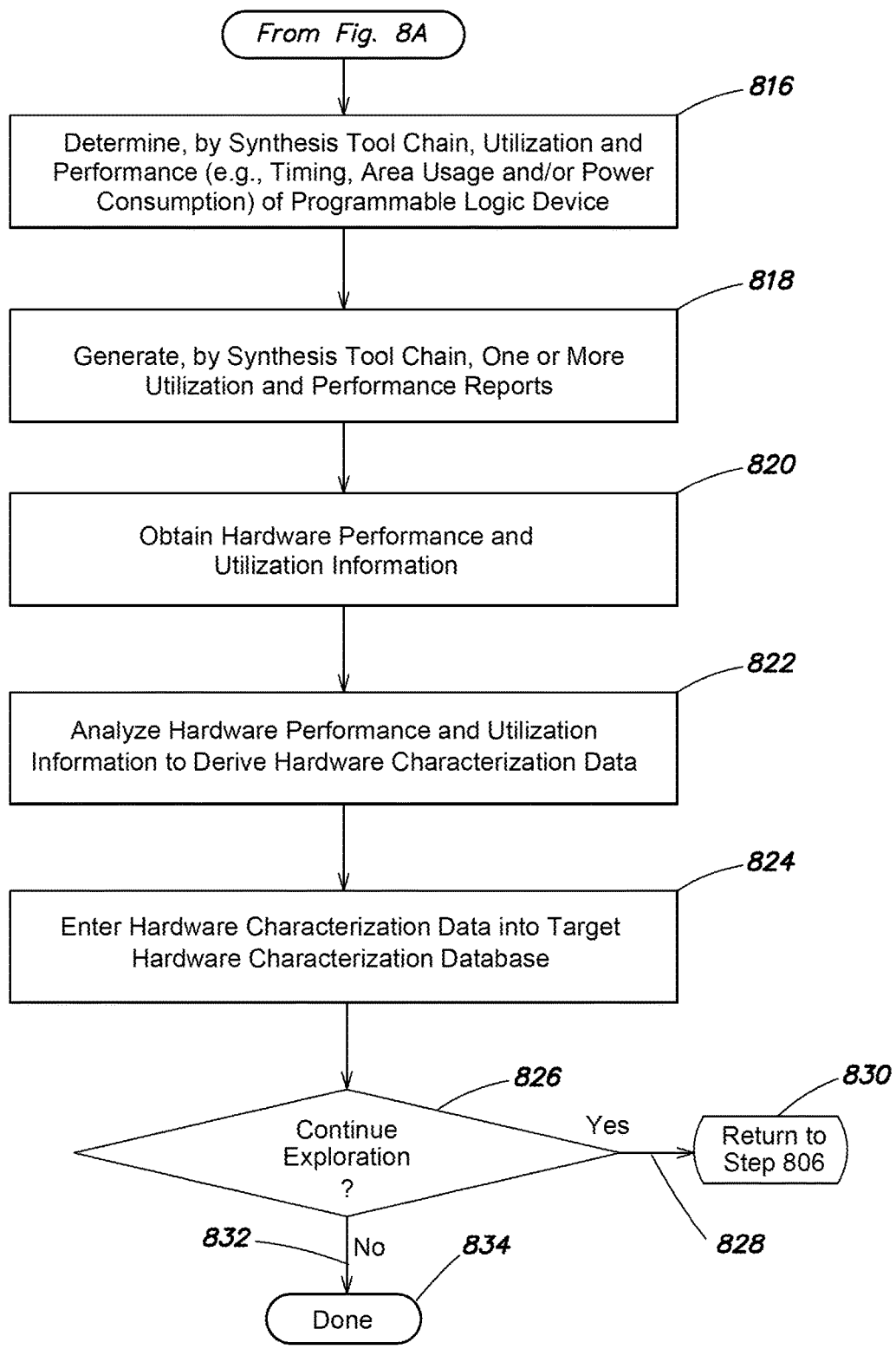

FIGS. 8A-B are partial views of a flow diagram of a method in accordance with an embodiment.

The hardware characterization database builder 700 may receive a designation of a particular synthesis tool chain, as indicated at step 802. It may also receive a designation of a particular type of programmable logic device, as indicated at step 804, for which characterization data is to be obtained and loaded into the target hardware characterization database 414. In some implementations, the hardware characterization database builder 700 may include an Application Programming Interface (API) through which a user may specify the synthesis tool chain and the programmable hardware device type, set options, and start the process of obtaining hardware characterization data. The API may include a plurality of methods that may be called for example by a user. Exemplary methods include:

CharacterizationConfig: this method may be used to create a CharacterizationConfig object with default settings.

setTargetTool: this method may be used to select the target synthesis tool, supported synthesis tools may include:
  Xlinix ISE,
  Xilinx Vivado, and
  Altera Quartus II.
To choose another tool, this method may be set to 'UserDefined'.

setTargetPartNumber: this method may be used to select the programmable logic device type, e.g., by part number/family.

setTargetLanguage: this method may be used to select a programming language for the code to be provided to the synthesis tool chain, exemplary languages include:
  Verilog,
  VHDL, and
  System Verilog.

setExplorationMode: this method may be used to set an exploration mode of the hardware characterization database builder 700. Exemplary modes include
  Explore: characterization explores different design points, such as different points in multiplier input width space to find DSP boundaries and pipelining; and
  DoNotExplore: uses user supplied models and data points for characterization.

addTrainingModels: this method may be used to supply training models for the hardware characterization process. The characterization process may use these training models to populate data points need to conduct hardware characterization.

addDataPoints: this method may be used to add specific data points to the hardware characterization process.

setTargetFrequencies: this method may be used to set frequencies to characterize.

setSynthesisToolFunction: this method may be used when a user chooses to use his own synthesis tool chain in order to supply a call back function that will be called for each data point. The Callback function should take a list of hdl files and a top module name, and return a number of DSP slices and target frequency achieved.

setRunDirectory: this method may be used to set a temporary location to run the characterization process.

runCharacterization: this method may be used to initiate the characterization process once all of the desired settings have been applied and/or configured.

The selector 702 may retrieve one or more of the scripts 708, training models 710, and data points 712 from the storage unit 704, based on the identified synthesis tool chain and type of programmable logic device, which may be specified using the setTargetTool and setTargetPartNumber methods, as indicated at step 806. In some embodiments, a user may provide one or more scripts, training models, and/or data points to be used to obtain characterization data for loading into the target hardware characterization database 414, for example through the addTrainingModels method, as indicated at step 808. For example, to the extent a user may want to obtain characterization data for a synthesis tool chain and/or a programmable logic device not supported by the existing data in the storage unit 704, the user may provide one or more custom-created scripts, training models, and/or data points.

The hardware characterization database builder 700 may modify the scripts or training models using the retrieved data points, which may be specified through the addDataPoints method. For example, to the extent the retrieved data points specify a range of input word lengths and/or pipeline depths, the hardware characterization database builder 700 may modify the scripts and/or training models to include the range of input word lengths and/or pipeline depths. The training models may be provided to or accessed by the code generator 802, which may generate code, as indicated at step 810. The generated code, the retrieved scripts identified by the selector 702 and/or any custom-created scripts received from the user may be provided by the hardware characterization database builder 700 to the synthesis tool chain 426, as indicated at step 812.

The hardware synthesis tool chain 426 may run the received scripts and may utilize the received code to synthesize the programmable logic device, as indicated at step 814. The synthesis process may involve a number of stages. For example, the synthesis tool 530 may convert the received scripts and generated code into one or more netlist files, technology and target specific bitstreams, or gate-level representations for configuring the programmable logic device. The mapping tool 532 may map logic in the netlist files to hardware components available on the programmable logic device, such as DSP slices, lookup tables, and RAM blocks. For an ASIC, logic may be mapped to standard cells from a user-provided ASIC technology library. The synthesis tool 530 and/or the mapping tool 532 may access the technology library 542 to select particular hardware components and hardware component implementations. The mapping tool 532 may produce one or more native circuit description (NCD) files.

The place and route tool 534 may receive the NCD files and select fixed positions on the programmable logic device for the hardware components. The place and route tool 534 may also route required connections between the placed hardware components using the target hardware's routing channels. The place and route tool 534 may produce one or more revised NCD files.

The programming file generator 536 may receive the revised NCD files from the place and route tool 534, and generate one or more files suitable for configuring the programmable logic device, such as bitstream files. The bitstream files may be used directly to configure the programmable logic device. For example, the synthesis tool chain 426 may be connected to the programmable logic device, and the bitstreams may be downloaded to the programmable logic device. To configure an ASIC, the synthesis tool chain 426 may generate a target-specific, gate-level representation rather than a bitstream. The synthesis tool chain 426 may also generate other files, such as a Standard Delay Format (SDF) file.

In some implementations, the synthesis tool chain 426 may not configure the programmable logic device, and may instead generate a utilization report from the bitstream or other synthesis file.

The performance analyzer 538 may determine the utilization and performance of the hardware implementation of the scripts and generated code, such as timing, area usage, and power consumption, as indicated at step 816 (FIG. 8B). Area usage metrics may be in terms of usage of LUTs, RAM blocks, and DSP slices, where usage may be numbers of hardware elements or percentages. The synthesis report generator 540 may generate one or more synthesis and/or hardware utilization reports that specify the timing, area usage, and/or power consumption characteristics of the programmable logic device, as indicated at step 818.

The hardware characterization database builder 700 may obtain hardware performance and utilization data by accessing the reports generated by the synthesis tool chain 426, as indicated at step 820. For example, the synthesis tool chain 426 may expose an Application Programming Interface (API) through which the hardware characterization database builder 700 may access the reports and/or data included in the reports or in databases or records created by the synthesis tool chain 426. The format and information included in the reports may vary depending on the vendor, model, and/or version of the synthesis tool chain 426. The hardware characterization database builder 700 may be configured with vendor-specific information concerning the format and information available from the reports generated by the synthesis tool chains of one or more vendors. Information concerning the API and/or API calls may be stored in the storage unit 704. The hardware characterization database builder 700 may perform a lookup, and retrieve the API to be used with a particular synthesis tool chain 426. The hardware characterization database builder 700 may have specific knowledge about multiple synthesis tool chains, such knowledge may include all necessary API calls and structure to set constraints, initiate the synthesis tool chains and extract performance data. Accordingly, the hardware characterization database builder 700 may interoperate with synthesis tool chains from different vendors.

In some embodiments, the synthesis tool chain 426 may generate an in-memory representation of performance data. For example, instead of a synthesis report, a synthesis tool chain may generate design objects. The design objects may be in-memory data structures that may resemble a C++ class, and may include performance data. The hardware characterization database builder 700 may access these design objects and extract performance data, for example, by issuing methods and/or function calls to the design objects to obtain performance data.

The hardware characterization database builder 700 may utilize this vendor-specific information to form API or other calls to the synthesis tool chain 426 to obtain the reports or data therefrom. The hardware characterization database builder 700 also may utilize vendor-specific information to filter the reports for particular information needed to obtain characterization data. The analysis and abstraction engine 706 may analyze the performance and utilization data obtained from the synthesis tool chain 426, as indicated at step 822. Specifically, the analysis and abstraction engine 706 may determine whether multipliers and adders included in the scripts and/or generated code were mapped to DSP slices of the programmable logic device. If yes, the analysis and abstraction engine 706 may enter characterization data into the target hardware characterization database 414, as indicated at step 824. The characterization data may indicate the architecture, input word lengths, number of pipeline stages, number of pipeline registers and their locations to achieve the number of pipeline stages, clock speed, and number of DSP slices to which the multipliers and/or adders were mapped.

In some embodiments, the hardware characterization database builder 700 may repeat the process in an effort to explore how changes to the scripts and/or generated code affect the mapping to DSP slices, RAM blocks, and LUTs. For example, the hardware characterization database builder 700 may determine whether to continue exploring the synthesis process, as indicated by decision step 826. If so, processing may return to step 806 (FIG. 8A), as indicated by Yes arrow 828 leading to Go To step 830. The selector 702 may choose different scripts 708 and/or training models 710. Alternatively or additionally, the selector may vary the scripts and/or training models 710. For example, the selector 702 may change the word length of inputs to a multiplier or adder, change the pipeline depth of the multiplier, change one or more constraints, change the structure or architecture, for example move the multipliers or adders relative to each other, or change the clock speed, among other variations. If the hardware characterization database builder 700 decides not to continue exploring the design space, processing may be complete, as indicated by No arrow 832 leading to Done step 834.

It should be understood that once the hardware characterization database builder 700 has run once for a given synthesis tool chain and programmable logic device type combination, and the obtained data has been processed, abstracted and loaded into the target hardware characterization database 414, the training process for that synthesis tool chain/programmable logic device type combination may be complete. That is, the training process does not have to be run again for that combination of synthesis tool chain and programmable logic device type combination.

The target hardware characterization database 414 may contain information obtained by synthesizing various target programmable logic devices using various synthesis tool chains. For example, sample code that describes various combinations of multipliers, adders, subtractors, feedback loops, etc. and that has various clock speed settings may be provided to the various synthesis tool chains, and used to synthesize the various programmable logic devices. Information regarding the resources utilized on the various programmable logic devices, such as CLBs, DSP slices and RAM blocks may be obtained and evaluated as described herein, and information concerning the utilization of DSP slices may be entered in the target hardware characterization database 414.

Exemplary synthesis tool chains include the Design Compiler from Synopsys, the Encounter RTL Compiler from Cadence, Quartus from Altera, XST from Xilinx, Precision RTL from Mentor Graphics, and Vivado Design Suite from Xilinx, among others.

In some implementations, hardware characterization data may be obtained, for example from vendors, and entered into the target hardware characterization database 414. In other embodiments, hardware characterization data may be provided directly to the code generator 408.

Figure 9A:
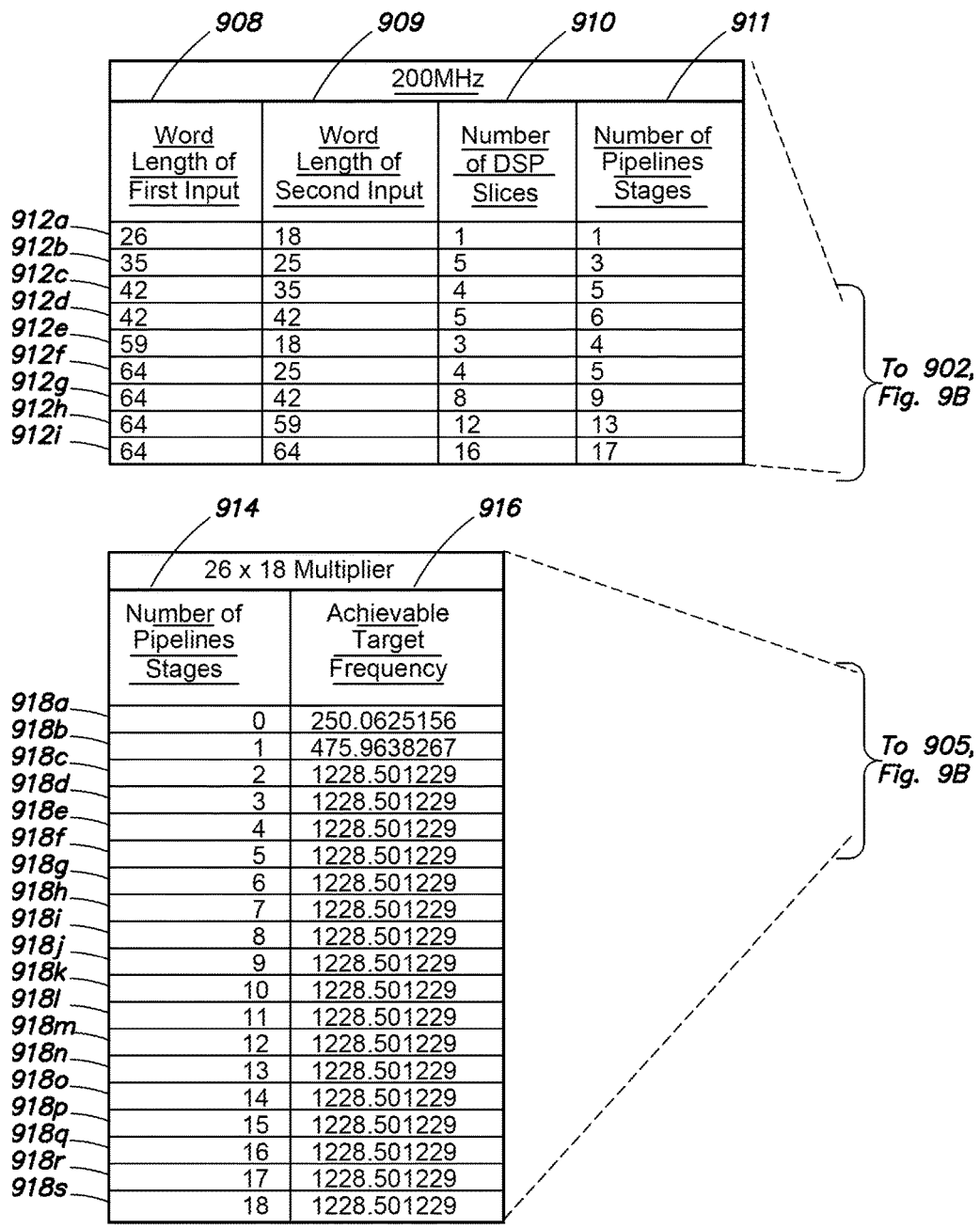
FIGS. 9A and 9B are partial views of a schematic illustration of an example database in accordance with an embodiment of the disclosure.
Figure 9B:
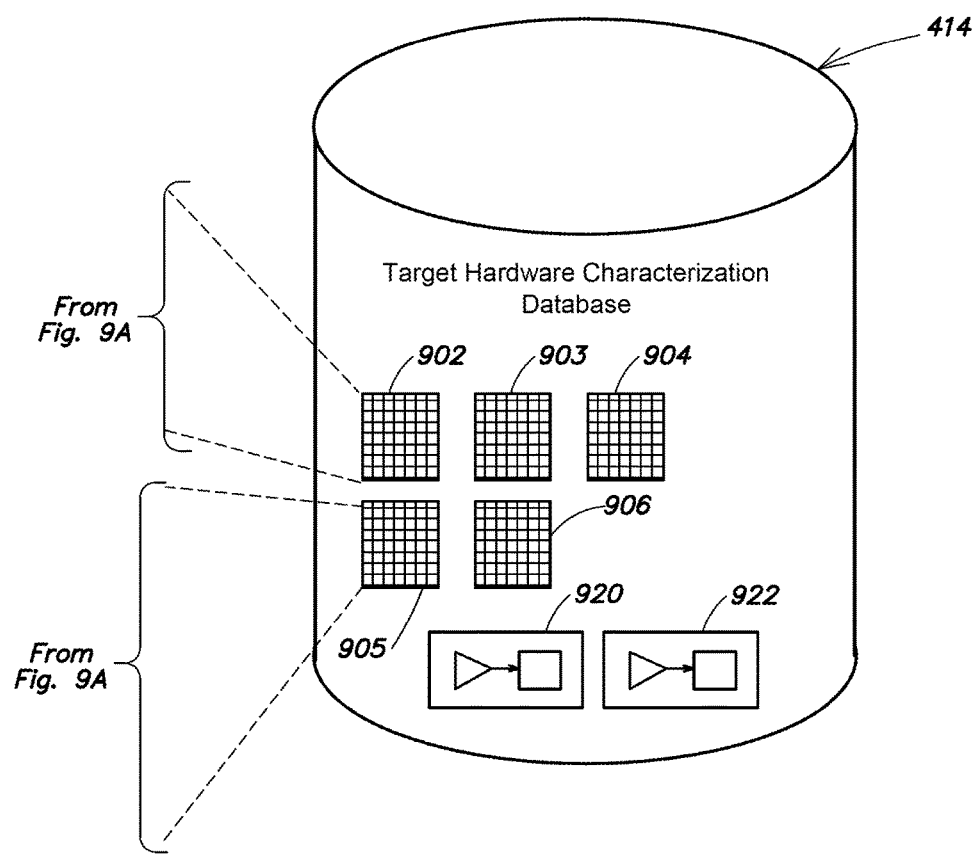

FIGS. 9A and 9B are partial views of a schematic illustration of the target hardware characterization database 414 in accordance with an embodiment of the disclosure. In an embodiment, the target hardware characterization database 414 may include a plurality of data structures containing hardware characterization data derived by the hardware characterization database builder 700 for a particular FPGA as synthesized by a particular synthesis tool chain. For example, the target hardware characterization database 414 may include a plurality of lookup tables, such as tables 902-906. The tables 902-906 may have columns and rows whose intersections define cells or records for storing information. The table 902, which is also shown in expanded view, may indicate the number of DSP slices to which a multiplier element may be mapped as a function of the word lengths of the inputs to the multiplier for a specific target device, e.g., a vendor-specific FPGA model. It should be understood that the target hardware characterization database 414 may include other tables, such as tables 903 and 904, that include information indicating the number of DSP slices to which multiplier elements may be mapped for other target devices, e.g., other FPGA types. The table 902 may include hardware characterization data for a particular clock speed of the multiplier, e.g., 200 MHz. The table 902 may include four columns 908-911 and a plurality of rows 912a-i. The column 908 may include information concerning the word length, e.g., bitwidth, of a first input to a multiplier. The column 909 may include information concerning the word length of a second input to the multiplier. The column 910 may indicate the number of DSP slices of the particular FPGA to which a multiplier with the respective input word lengths will map. The column 911 may indicate the number of pipeline stages to be added to the multiplier, e.g., to an intermediate representation of the multiplier, such that the respective multiplier will be mapped to one or more DSP slices of the particular FPGA when HDL code, generated from the intermediate representation, is synthesized by the particular synthesis tool.

The table 905, which is also shown in expanded view, may indicate the number of pipeline stages to be added to a multiplier in order for the multiplier to be mapped to a DSP slice as a function of a desired target frequency. The table 905 includes information for a specific bitwidth, e.g., 26×18, for a specific target device. It should be understood that the target hardware characterization database 414 may include other tables, such as table 906, that include information indicating the number of pipeline stages to be added to multipliers of other bitwidths and/or for other target devices. The first input to the multiplier may have a word length of up to 26, and the second input may have a word length of up to 18. The table 905 may include two columns 914 and 916, and a plurality of rows 918a-s. The column 914 may include information concerning the number of pipeline stages, and the column 916 may include the achievable target frequency.

Figure 10:
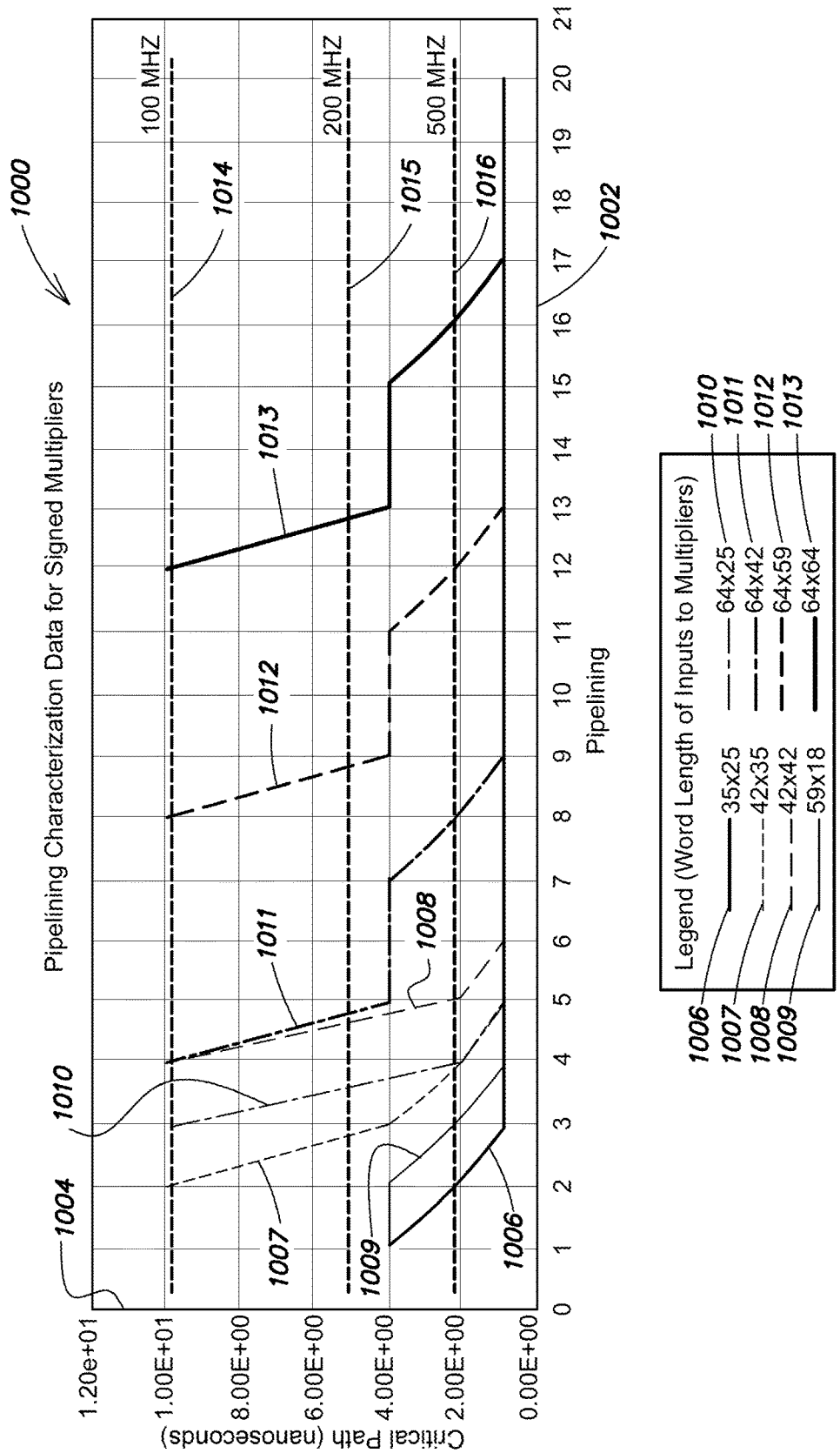
FIG. 10 is a schematic illustration of an example chart including hardware characterization data in accordance with an embodiment of the disclosure.

FIG. 10 is a schematic illustration of a chart 1000 containing hardware characterization data for a plurality of multipliers that may be used in models. The chart 1000 indicates the number of output pipeline stages needed to achieve a critical path latency for a number of different multipliers. The term critical path may refer to the data path through the source model having the largest latency or delay. The chart 1000 indicates the latency for a number of different multipliers as a function of the number of output pipeline stages. The x-axis 1002 indicates the number of pipeline stages (pipelining) from 0 to 21. The y-axis 1004 indicates the critical path latency in nanoseconds. The chart 1000 includes eight plots 1006-1013. The plot 1006 corresponds to a multiplier having input word lengths up to 35×25. The plot 1007 corresponds to a multiplier having input word lengths above 35×25 up to 42×35. The plot 1008 corresponds to a multiplier having input word lengths above 42×35 up to 42×42. The plot 1009 corresponds to a multiplier having input word lengths above 42×42 up to 59×18. The plot 1010 corresponds to a multiplier having input word lengths above 59×18 up to 64×25. The plot 1011 corresponds to a multiplier having input word lengths above 64×25 up to 64×42. The plot 1012 corresponds to a multiplier having input word lengths above 64×42 up to 64×59. The plot 1013 corresponds to a multiplier having input word lengths above 64×59 up to 64×64. The chart 1000 also includes three frequency markers 1014-1016 corresponding to respective critical path latencies. The frequency marker 1014 corresponds to a clock rate of 100 MHz (10 nanoseconds). The frequency marker 1015 corresponds to a clock rate of 200 MHz (5 nanoseconds). The frequency marker 1016 corresponds to a clock rate of 500 MHz (2 nanoseconds).

As indicated by the plot 1013 of the chart 1000, 17 output pipeline stages are needed to achieve a clock rate of 500 MHz for a multiplier whose input word lengths are 64×64, whereas 13 output pipeline stages are needed to achieve a clock rate of 200 MHz. As indicated by the plot 1008, 5 output pipeline stages are needed to achieve a clock rate of 500 MHz, if the input word lengths to the multiplier are 42×42.

The hardware characterization data of the chart 1000 may correspond to a specific target hardware device and particular synthesis tool. Other charts having hardware characterization data for other combinations of target hardware devices and synthesis tools may be created. It should be understood that the chart of FIG. 10 is intended for illustrative purposes, and that other data structures, such as lookup tables, may be used to store the hardware characterization data represented by the chart 1000.

The characterization data represented by the chart 1000 may be included in the target hardware characterization database 414.

It should be understood that the target hardware characterization database 414 may include other tables containing hardware characterization data for other combinations of synthesis tool chains, programmable logic device types, and clock speeds. The target hardware characterization database 414 also may include information regarding the number and location of pipeline registers to add to an element and/or component to achieve a stated pipeline depth. In some implementations, this information may be in the form of subsystem or model structures, such as subsystem structures 920 and 922.

Figure 11:
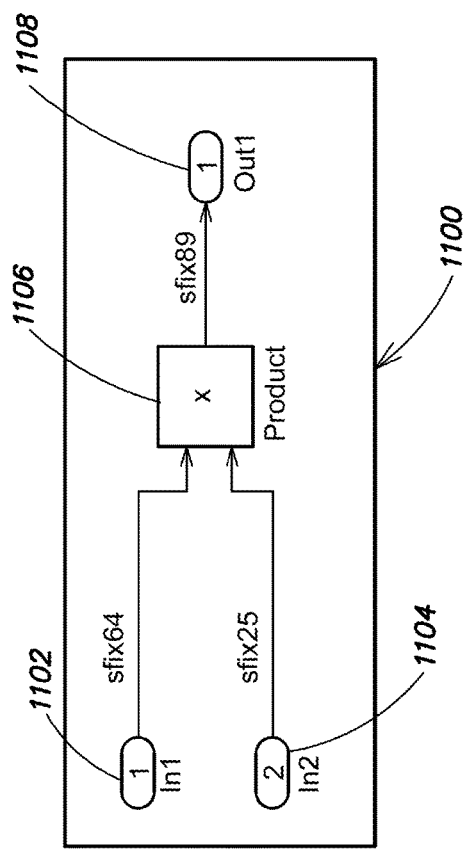
FIG. 11 is a schematic illustration of an example model portion in accordance with an embodiment of the disclosure.

FIG. 11 is a schematic illustration of a portion 1100 of a model. The model portion 1100 includes two Inport elements 1102 and 1104, a multiplier 1106, and an Outport element 1108. The Inport element 1102 provides a fixed point data type having a word length of 64 bits to a first input of the multiplier 1106. The Inport element 1104 provides a fixed point data type having a word length of 25 bits to a second input of the multiplier 1106. The output of the multiplier 1106 is a fixed point data type having a word length of 89, and the output is provided to the Outport element 1108. Suppose the model portion 1100 is to be implemented on a particular programmable logic device by a particular synthesis tool, and that the target frequency for the programmable logic device is 300 MHz. Suppose further that the particular programmable logic device includes DSP slices that have one 25×18 multiplier. The DSP slice targeting engine 412 may modify the model portion 1100, based on information from the target hardware characterization database 414, so that the multiplier 1106 will be implemented by a plurality of DSP slices of the particular programmable logic device, as opposed to being implemented by a plurality of Configurable Logic Blocks (CLBs), for example.

Figure 12:
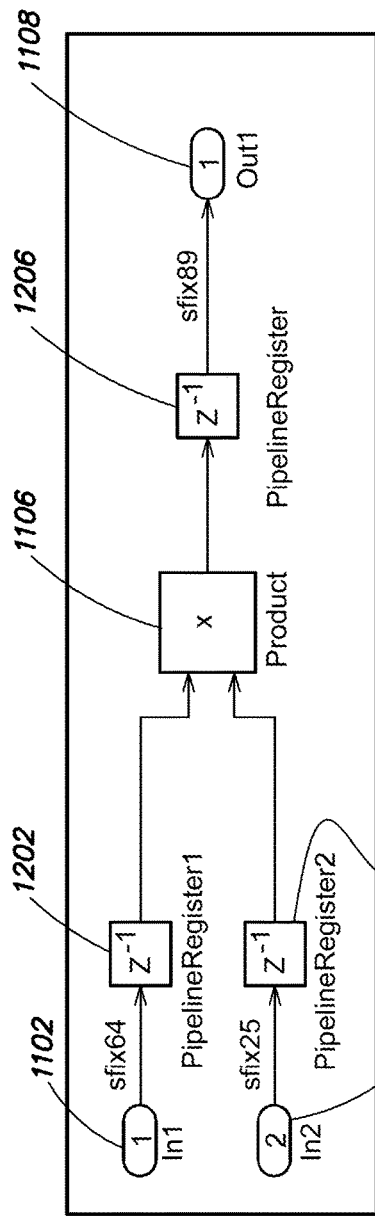
FIG. 12 is a schematic illustration of an example modified model portion in accordance with an embodiment of the disclosure.

FIG. 12 is a schematic illustration of a model portion 1200 illustrating the modifications that may be made by the DSP slice targeting engine 412 to the original model portion 1100. For example, based on the information obtained from the target hardware characterization database 414, the DSP slice targeting engine 412 may add a plurality of pipeline registers: a pipeline register 1202 at the first input of the multiplier 1106; a pipeline register 1204 at the second input of the multiplier 1106; and a pipeline register 1206 at the output of the multiplier 1106.

Code may be generated for the model portion 1200, and the generated code may be used by the synthesis tool to synthesize a programmable logic device. Because of the modifications, e.g., the addition of the pipeline registers 1202, 1204, and 1206, the code for the model portion 1200 may be mapped to a plurality, for example four, DSP slices of the particular programmable logic device. The four DSP slices may be cascaded. The two pipeline registers 1202 and 1204 at the multiplier's inputs may represent one pipeline stage, and the one pipeline register 1206 at the multiplier's output may represent a second pipeline stage.

The pipeline registers 1202, 1204, and 1206 may be implemented in the model using Delay blocks. Nonetheless, it should be understood that other model elements may be used to implement the pipeline registers 1202, 1204, and 1206.

Suppose the target frequency for the programmable logic device is 600 MHz instead of 300 MHz. For this target frequency, the information in the target hardware characterization database 414 may indicate a different number and/or placement of pipeline registers such that the multiplier 1106 is mapped to a plurality of DSPs of the programmable logic device.

Figure 13:
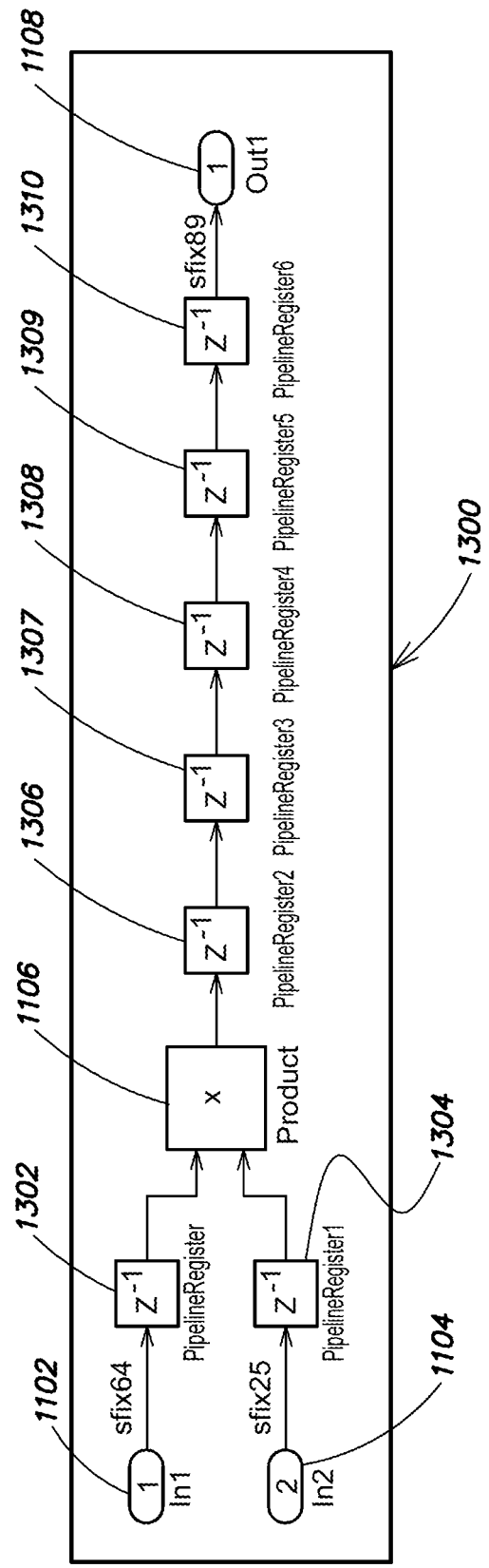
FIG. 13 is a schematic illustration of an example modified model portion in accordance with another embodiment of the disclosure.

FIG. 13 is a schematic illustration of a model portion 1300 illustrating the modifications that may be made by the DSP slice targeting engine 412 to the original model portion 1100. For example, based on the information obtained from the target hardware characterization database 414, the DSP slice targeting engine 412 may add a plurality of pipeline registers to the original model portion 1100. For example, the DSP slice targeting engine 412 may add pipeline registers 1302 and 1304 at the multiplier's inputs. In addition, the DSP slice targeting engine 412 may add five pipeline registers 1306-1310 at the multiplier's output. The pipeline registers 1302, 1304, and 1306-1310 may be implemented using Delay blocks. In some embodiments, the five pipeline registers 1306-1310 at the multiplier's output may be implemented by a single Delay block configured with a delay of five.

Code may be generated for the model portion 1300, and the generated code may be used by the synthesis tool to synthesize a programmable logic device. Because of the modifications made to the original model portion 1100 by the DSP slice targeting engine 412, e.g., the addition of the pipeline registers 1302, 1304, and 1306-1310, the model portion 1300 may be mapped to a plurality, for example four, DSP slices of the target programmable logic device. The four DSP slices may be cascaded. The two pipeline registers 1302 and 1304 at the multiplier's inputs may represent one pipeline stage, and the five pipeline registers 1306-1310 at the multiplier's output may represent five pipeline stages.

It should be understood that the target hardware characterization database 414 may include information for modifying other model portions and/or model elements in addition to multipliers. For example, the target hardware characterization database 414 may include information indicating the number and placement of pipeline registers to be added to gain model elements and product model elements, among others, such that these model elements are implemented by DSP slices of a target programmable logic device. In some implementations, a gain model element may multiply its one input by a constant value (gain). Product or multiply model elements may multiply their two inputs.

Figure 14:
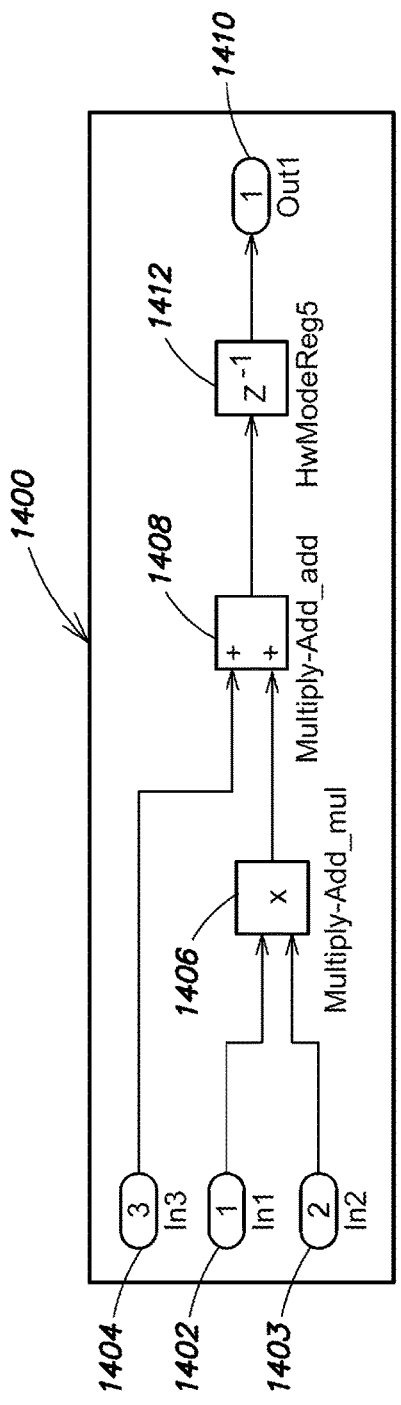
FIG. 14 is a schematic, example illustration indicating the number and location of pipeline registers to be added to a model component to achieve a pipeline depth in accordance with an embodiment of the disclosure.

FIGS. 14-17 are schematic illustrations of multiply-add model components indicating the number and location of pipeline registers to achieve various pipeline depths for different synthesis tool chain/programmable logic device combinations. FIG. 14 is a schematic illustration of a multiply-add component 1400, which includes three Inport elements 1402-1404, a multiply element 1406, an add element 1408, and an Outport element 1410. The multiply-add component 1400 indicates the number and location of pipeline registers to achieve a pipeline depth of one for the Quartus synthesis tool chain and an Altera programmable logic device. To achieve a pipeline depth of one for this combination of synthesis tool chain and programmable logic device, one pipeline register 1412 is added to the multiply-add component 1400, and the one pipeline register 1412 is located between the add element 1408 and the Outport element 1410, at an output port of the add element 1408.

Figure 15:
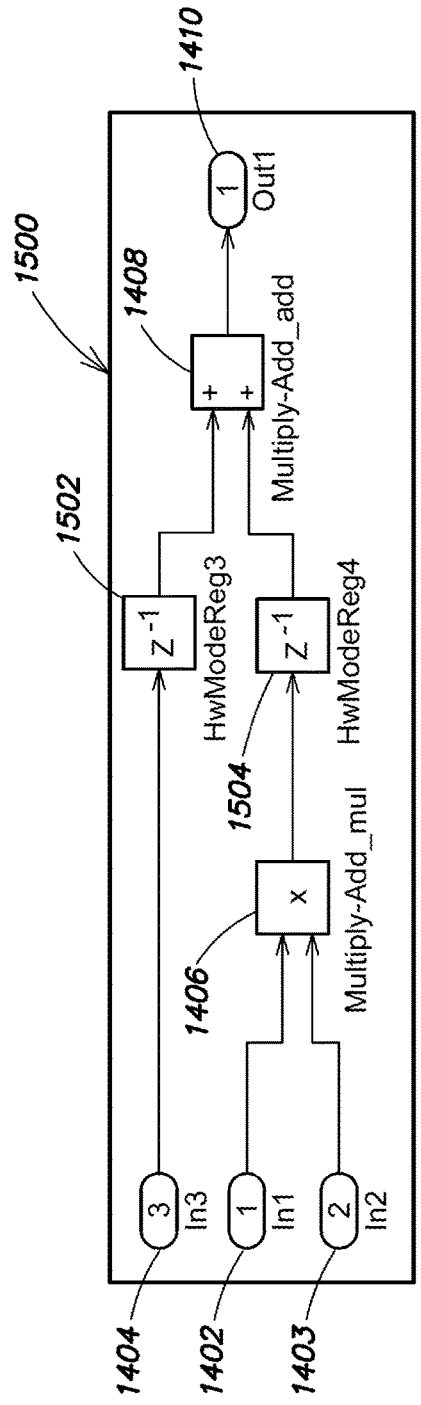
FIG. 15 is a schematic, example illustration indicating the number and location of pipeline registers to be added to a model component to achieve a pipeline depth in accordance with another embodiment of the disclosure.

FIG. 15 is a schematic illustration of a multiply-add component 1500 indicating the number and location of pipeline registers to achieve a pipeline depth of one for the XST synthesis tool chain and a Xilinx programmable logic device. To achieve a pipeline depth of one for this combination of synthesis tool chain/programmable logic device type, two pipeline registers 1502 and 1504 are added to the multiply-add component 1500. The pipeline register 1502 is located between the Inport element 1404 and the add element 1408, at a first input port of the add element 1408. The pipeline register 1504 is located between the multiply element 1406 and the add element 1408, at a second Inport port of the add element 1408.

Figure 16:
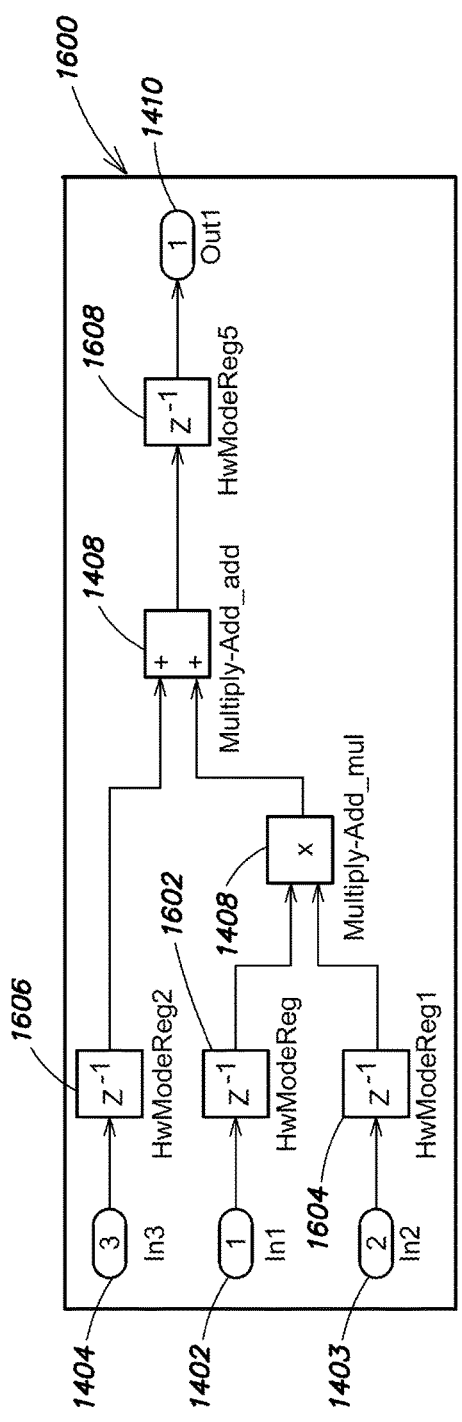
FIG. 16 is a schematic, example illustration indicating the number and location of pipeline registers to be added to a model component to achieve a pipeline depth in accordance with another embodiment of the disclosure.

FIG. 16 is a schematic illustration of a multiply-add component 1600 indicating the number and location of pipeline registers to achieve a pipeline depth of two for the Quartus synthesis tool chain and an Altera programmable logic device. As shown, to achieve a pipeline depth of two for this combination of synthesis tool chain/programmable logic device type, four pipeline registers 1602, 1604, 1606, and 1608 are added to the multiply-add component 1600. The pipeline registers 1602 and 1604 are located at input ports of the multiplier element 1406. The pipeline register 1606 is located at an input port of the adder element 1408. The pipeline register 1608 is located at an output port of the adder element 1408.

Figure 17:
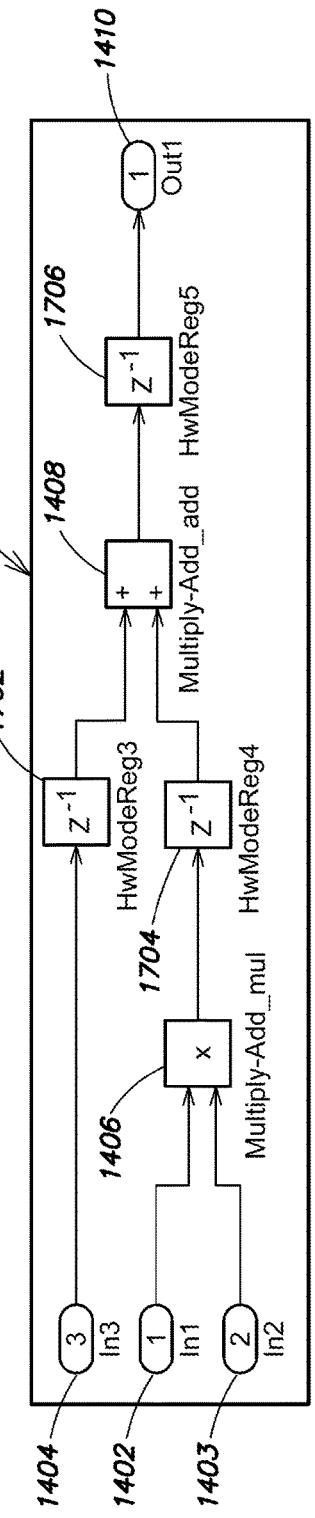
FIG. 17 is a schematic, example illustration indicating the number and location of pipeline registers to be added to a model component to achieve a pipeline depth in accordance with another embodiment of the disclosure.

FIG. 17 is a schematic illustration of a multiply-add component 1700 indicating the number and location of pipeline registers to achieve a pipeline depth of two for the XST synthesis tool chain and a Xilinx programmable logic device. For this combination of synthesis tool chain/programmable logic device type, three pipeline registers 1702, 1704, and 1706 are added to the multiply-add component 1700. The pipeline registers 1702 and 1704 are located at input ports of the add element 1408. The pipeline register 1706 is located at an output port of the add element 1408.

Information regarding the number and location of pipeline registers to achieve various pipeline depths for various combinations of synthesis tool chains/programmable logic device types, as illustrated in FIGS. 14-17 may be included in the target hardware characterization database 414.

Flow Diagram

Figure 18A:
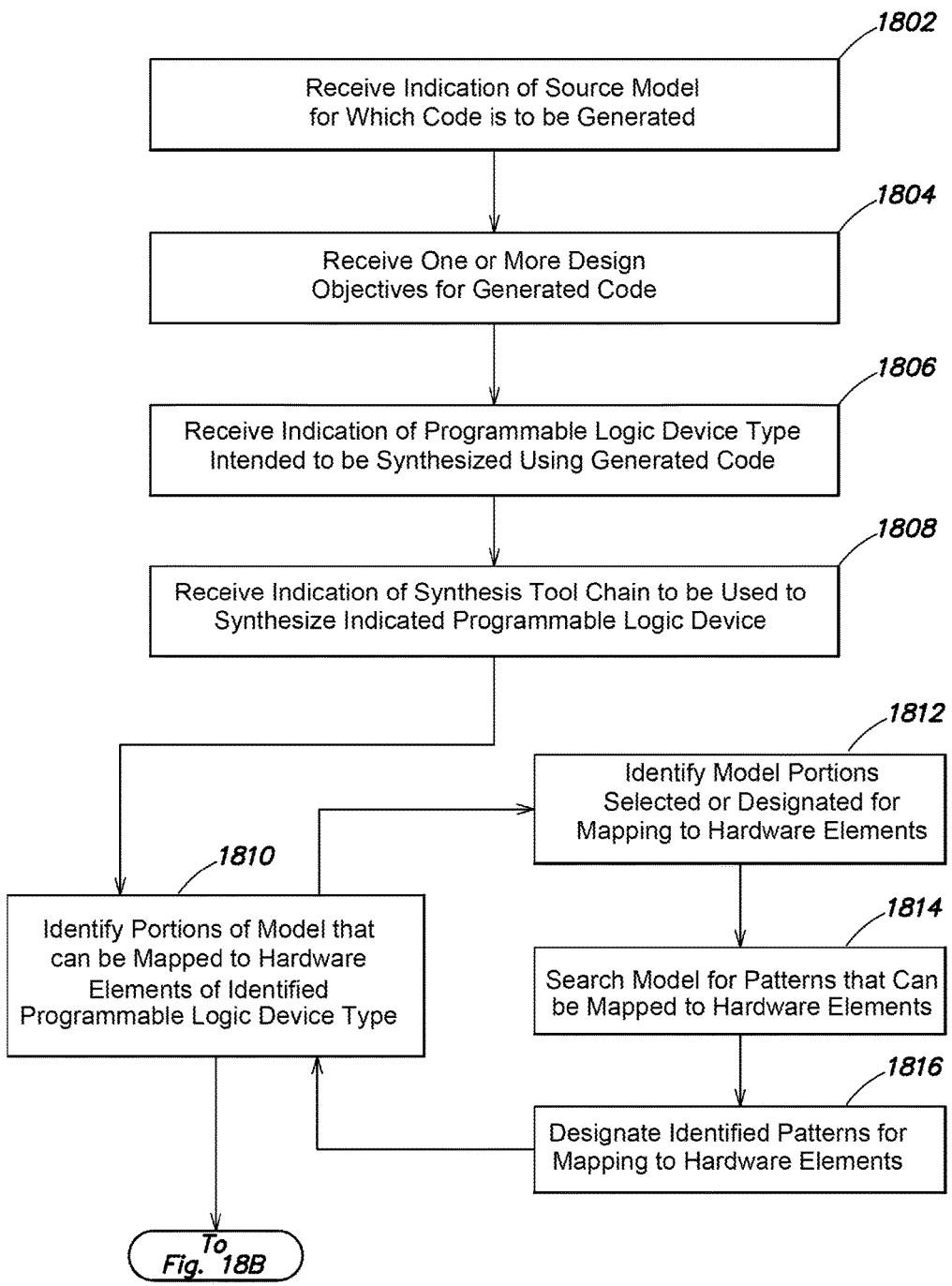
FIGS. 18A-B are partial views of a flow diagram of an example method in accordance with an embodiment of the disclosure.
Figure 18B:
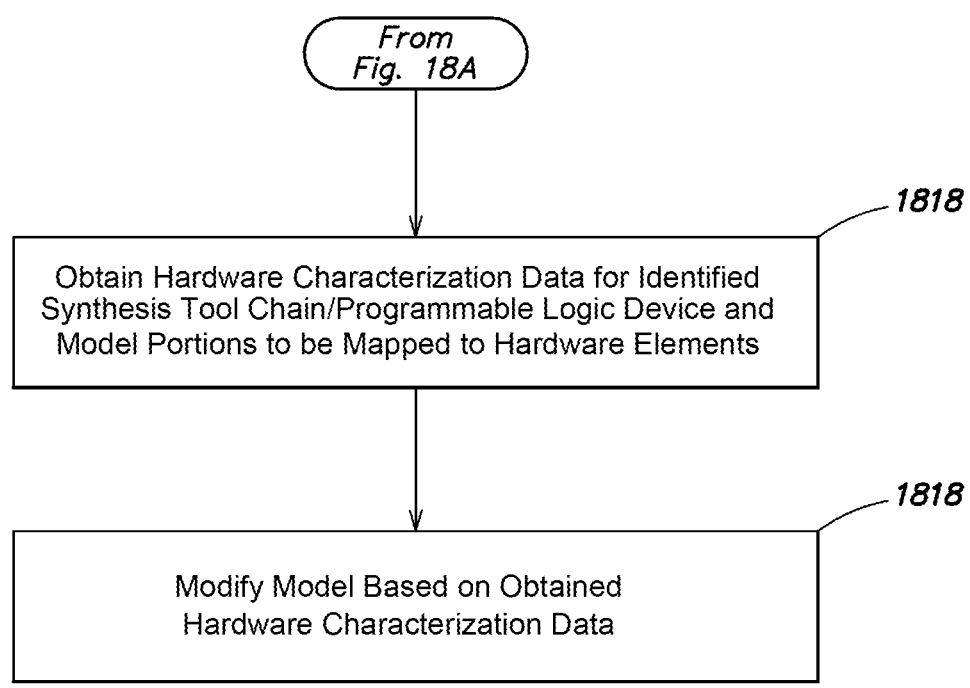

FIGS. 18A-18B are partial views of a flow diagram of a method in accordance with an embodiment. An executable model, such as the model 402 (FIG. 4A), for which code, such as HDL code, is to be generated may be received by or indicated to the code generator 408, as indicated at step 1802. The code generator 408 may further receive one or more design objectives, which may be in the form of hardware performance constraints, on a hardware implementation of the model 402, as indicated at step 1804. Exemplary hardware performance constraints include constraints concerning timing, area usage, and/or power consumption. For example, a timing constraint may relate to the clock speed at which the target programmable logic device 508 is to operate, such as 200 MHz, 500 MHz, 1 GHz, etc. The timing constraint may be specified globally for the target programmable logic device 508, or it may be specified for a particular path through the model 402. An area usage constraint may specify a maximum number of logic elements, such as CLBs, DSP slices, RAM blocks, Lookup Tables (LUTs), Multipliers, Registers, Floating Point Units, Intellectual Property (IP) blocks, such as Altera Megafunctions from Altera Corporation, Xilinx CORE Generation System from Xilinx Inc., and DesignWare from Synopsys, Inc. of Mountain View, Calif., among other vendor specific IP, of the target programmable logic device 508. A power constraint may specify a maximum power for the target programmable logic device 508.

The one or more hardware performance constraints may be user specified. For example, the UI engine 510 may present a GUI or CLI having one or more graphical affordances. A user may enter a desired hardware performance constraint through the one or more graphical affordances.

In some embodiments, the UI engine 510 may generate a user interface, such as a graphical user interface (GUI), for presentation to the user, e.g., on a display of a data processing device. The GUI may include one or more controls through which the user can select or specify options, such as the identification of the model 402 or one or more subsystems or other portions of the model 402 for which code generation is to be performed, and the one or more hardware performance constraints. The GUI also may include one or more command buttons through which the user can initiate code generation for the identified model or portion thereof.

It should be understood that the UI engine 510 may additionally or alternatively present a Command Line Interface (CLI) through which a user may identify the model 402 or portions thereof, specify the one or more constraints, and initiate the code generation process.

The code generator 408 may further receive an indication of the particular programmable logic device that is intended to be synthesized from the code to be generated, as indicated at step 1806, as well as an indication of the synthesis tool chain to be used to synthesize the identified programmable logic device, as indicated at step 1808. The particular programmable logic device may be identified by vendor name and model name and/or number. The identity of the particular programmable logic device may be entered in a data entry box or selected from a drop down list presented on an options setting page for the code generation process. The particular synthesis tool chain may be identified by vendor name and/or product name and release number, and may also be entered in a data entry box or selected from a drop down menu.

The code generator 408 may proceed to generate code automatically for the model 402 or portion(s) thereof. In an embodiment, several stages may be involved in generating code for the model 402. For example, the front-end processing unit 618 may perform a number of preliminary tasks, such as analyzing the syntax and semantics of the model 402, error detection and reporting, capturing dataflow relationships, determining block semantics, such as the type of block, determining particular block and/or subsystem parameter settings, as established by the user, etc. This information may be provided by the front-end processing unit 618 to the Intermediate Representation (IR) generator 620.

The IR generator 620 may generate a series of in-memory IRs for the model 402. For example, the IR generator 620 may apply elaboration or lowering operations, starting with the initial IR 528, thereby producing the one or more transitional IRs 624. Exemplary elaboration or lowering operation, which may also be referred to as transforms, include procedure in-lining, loop transformations, global and local optimizations, register allocation, and programmable logic device dependent optimizations. Transforms may be applied until the final IR 626 is constructed, whose structure is suited to code generation, specifically HDL code generation, by the back-end processing unit 622. Exemplary transforms may include scalarization of vector or array values, transformations of complex datatypes to real and imaginary values, merging delays, e.g., merging smaller delays together to form larger delays, which may map better to FPGAs, mapping delays to RAMs, lowering conditional subsystems, such as enabled and triggered subsystems, and target-specific transforms, e.g., for VHDL and Verilog.

In an embodiment, one or more of the initial IR 528, the transitional IRs 624, and the final IR 626 may be graph-based, object-oriented structures. For example, one or more of the IRs may be in the form of a hierarchical, Data Flow Graph (DFG), or in the form of a Parallel Intermediate Representation (PIR), which has a plurality of IR objects, including nodes interconnected by edges. The nodes of the PIR may represent model elements of the model 402 or portions thereof in an abstract manner. The edges of the PIR may represent the connections between the model's model elements. For example, each model element of the model 402 may map to one or more nodes of the PIR, and each data, signal, control, or event line or arrow of the model 402 may map to one or more edges of at least the initial PIR 528. Special nodes, called network instance components (NICs), provide hierarchy in the PIR, for example, by abstractly representing subsystems of the model 402.

One or more nodes of the various IRs 528, 624, 626 may a Control Flow Graph (CFG), Control Data Flow Graph (CDFG), program structure tree (PST), abstract syntax tree (AST), etc. A CDFG may capture the control flow as well as the data flow of a graphical model through data dependency and control dependency edges. The initial IR 528 and the final IR 626 may be saved to memory, such as a main memory or a persistent memory of a data processing device. One or more, or all, of the transitional IRs 624 also may be saved in memory. Additionally or alternatively, one or more snap shots may be taken of the IR during the code generation process.

The code generator 408 may identify one or more portions of the model 402, such as elements, subsystems, components, etc., that may be mapped to elements of the programmable logic device, such as DSP slices, RAM blocks, etc., as indicated at step 1810. For example, the DSP slice targeting engine 412 may identify portions of the model 402 designated or selected for mapping to hardware elements, such as multipliers, gains, adders, lookup tables, etc., as well as model portions designed to map to hardware elements, such as Multiply-Accumulate (MAC) elements 515 and Multiply-Add elements 517, as indicated at step 1812.

In some embodiments, the DSP slice targeting engine 412 may analyze one or more IRs, and identify portions of the one or more IRs, such as IR structures, that are suitable for mapping to one or more DSP slices or other hardware elements of a programmable logic device, for example with some processing. The DSP slice targeting engine 412 may identify individual IR nodes or elements that can be mapped, with some processing, to one or more hardware elements, or combinations of IR nodes or elements that may be grouped together and mapped, with some processing, to one or more hardware elements. In some cases, the IR portions, structures, nodes, or elements may not correspond directly to particular model elements of a model. For example, the IR being analyzed may result from numerous lowering or elaboration operations, such that the IR has an overall structure that differs, sometimes possibly significantly, from the model.

For example, the DSP slice targeting engine 412 may identify an IR node (or group of IR nodes) that performs a multiply operation and whose output feeds another IR node (or group of IR nodes) that performs an add operation or a subtract operation. The DSP slice targeting engine 412 may combine the two nodes (or the two groups of nodes) into a Multiply-Add or a Multiply-Subtract structure, and may modify the Multiply-Add or a Multiply-Subtract structure so that it will be mapped to a particular hardware element, such as one or more DSP slices, of a programmable logic device. Exemplary modifications may include altering the word length (e.g., bitwidth) of inputs to multiplier, adder, or subtract nodes, including chains of multiplier, adder, or subtract nodes, changes to pipeline depth, changes to output data type, changes to rounding mode, and changes to saturation. The DSP slice targeting engine 412 also may identify an IR node (or group of IR nodes) that performs a multiply operation whose output feeds, via a register, another IR node (or another group of IR nodes) that performs an add operation or a subtract operation, where another second register exists at the other input of the other IR node (or other group of IR nodes). The DSP slice targeting engine 412 may combine the two nodes (or the two groups of IR nodes) and the registers into a Multiply-Add or a Multiply-Subtract structure. The DSP slice targeting engine 412 may additionally modify the Multiply-Add or a Multiply-Subtract structure, for example by setting one or more properties of the Multiply-Add or Multiply-Subtract structures to particular values, so that it will be mapped to a particular hardware element, such as one or more DSP slices, of a programmable logic device. Other modifications in addition to those mentioned above include adding registers at particular locations of the Multiply-Add or a Multiply-Subtract structure to achieve a desired pipeline depth. For example, a Pipeline Depth property of the Multiply-Add or Multiply-Subtract structures may be set to a particular value, such as 1.

In another example, the DSP slice targeting engine 412 may identify an IR node (or group of IR nodes) that performs a multiply operation whose output feeds another IR node (or another group of IR nodes) that performs an add operation or a subtract operation, and the output of the other IR node (or the other group of IR nodes) may be received by one or more IR nodes that perform a data type conversion operation. The DSP slice targeting engine 412 may combine the two nodes (or the two groups of nodes) as well as the one or more data type conversion nodes into a Multiply-Add or a Multiply-Subtract structure. The DSP slice targeting engine 412 may modify the Multiply-Add or a Multiply-Subtract structures, for example by setting one or more properties of the Multiply-Add or Multiply-Subtract structures, to have a data type that corresponds to the data type of the one or more IR nodes performing the data type conversion operation.

In yet another example, the DSP slice targeting engine 412 may identify a group of IR nodes that performs a dot product operation on two vector inputs, e.g., of N elements. For example, the group of IR nodes may implement the following functionality:

$$\text{Dot product} = \sum_{i=1}^{N} (A(i) * B(i))$$

For example, one or more IR nodes of the group may perform element wise multiplication, while one or more other IR nodes of the group may sum the output elements of the multiplication. The DSP slice targeting engine 412 may combine the IR nodes into (or replace them with) a Multiply-Accumulate structure, and may modify the Multiply-Accumulate structure so that it will be mapped to a particular hardware element, such as one or more DSP slices, of a programmable logic device.

It should be understood that the DSP slice targeting engine 412 may identify and process other IR nodes and/or structures in addition to the above examples. For example, other IR structures that may be identified include multipliers and adders or subtractors with registers located at the output of the adders or the subtractors and/or at the inputs of the multiplier.

In some embodiments, the processing of IR structures may be target hardware dependent. For example, the DSP slice targeting engine 412 may perform different processing on an IR structure depending on the architecture of the target hardware. For example, the DSP slice targeting engine 412 may insert and/or move registers to different locations depending on the target hardware. That is, one type of target hardware may support registers at an output of a multiplier while another type of target hardware may support registers between an adder and a multiplier. The DSP slice targeting engine 412 may insert and/or move registers to conform to the architecture of the target hardware.

As described, processing of an IR may include replacing existing IR nodes with a new structure, such as a Multiply-Add, Multiply-Subtract, or Multiply-Accumulate, and setting one or more properties of the Multiply-Add, Multiply-Subtract, or Multiply-Accumulate to particular values based on the arrangement of the existing IR nodes and the characteristics of the target programmable logic device.

In some embodiments, the pattern recognizer 627 may search the model for one or more predefined patterns, for example, interconnected model element or IR node structures, that can be mapped to one or more hardware elements, as indicated at step 1814. In some embodiments, the predefined patterns may be global patterns that may be mapped to hardware elements, such as DSP slices, of different programmable logic devices. In some implementations, the code generator 408 may perform the identify and search steps on one or more IRs.

Figure 21:
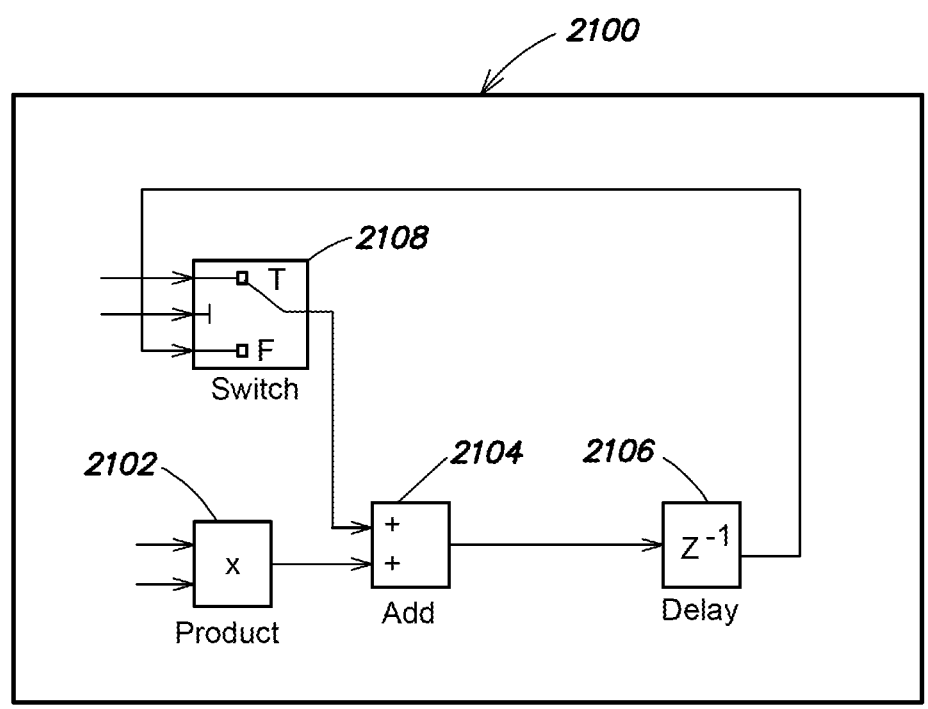
FIG. 21 is a schematic, example illustration of a pattern in accordance with an embodiment of the disclosure.

FIG. 21 is a schematic illustration of a predefined pattern 2100 in accordance with an embodiment of the disclosure. The predefined pattern 2100 is illustrated in the form of a model portion. In some implementations, patterns may be defined as model portions and/or as portions of IRs. The pattern 2100 may include a multiply element (Product) 2102, an adder element (Add) 2104, a delay element 2106, and a switch element 2108. The adder element 2104 may receive the output of the multiply element 2102 and the switch element 2108. The delay element 2106 may receive the output of the adder element 2104. The output of the delay element 2106 may be fed back to one of the data inputs of the switch element 2108.

While the pattern 2100 is illustrated using model elements for ease of explanation, it should be understood that the pattern may be in the form of an interconnected IR node structure.

In other embodiments, the pattern recognizer 627 may search for different patterns depending on the identified target programmable logic device and the identified synthesis tool chain. For example, the target hardware characterization database 414 may store the predefined patterns. The pattern recognizer 627 may perform a lookup on the target hardware characterization database 414 using the identified target programmable logic device and the synthesis tool chain as inputs, and retrieve one or more patterns associated with the identified target programmable logic device and the synthesis tool chain. Other patterns may include the MAC element and Multiply-Add element.

Returning to FIG. 18A, the pattern recognizer 627 may designate one or more of the identified patterns for mapping to one or more hardware elements, as indicated at step 1816. The DSP slice targeting engine 412 may perform a lookup on the target hardware characterization database 414, as indicated at step 1818 (FIG. 18B). The DSP slice targeting engine 412 may perform the lookup to determine whether modifications should be made to the one or more identified patterns such that the patterns will be mapped to one or more hardware elements, such as DSP slices, when code is generated and the code is used to synthesize the programmable logic device. The DSP slice targeting engine 412 may modify the model based on the information retrieved from the hardware characterization database 414, as indicated at step 1820. For example, while a multiply-add in the form of c+a*b may be mapped to a DSP slice of many programmable logic devices, the target hardware characterization database 414 may include information indicating that, for the particular FPGA 100, a multiply-add in the form of a*b+c will not map to a DSP slice of the particular FPGA 100. The DSP slice targeting engine 412 may modify the transitional IR 624 so that a multiply-add in the form of a*b+c is rewritten as c+a*b, such that it will be mapped to a DSP slice of the particular FPGA 100.

In some implementations, the pattern recognizer 627 may search for and identify one or more matrix multiply elements included in the model 402. A matrix multiply element may be a multiply element where at least one input is a vector or a matrix of values. The DSP slice targeting engine 412 may replace a matrix multiply element with one or more MAC elements 515. For example, where a matrix multiply element of the model 402 has a first input of size N×M and a second input of size M×P, the DSP slice targeting engine 412 may replace the matrix multiply element with (N*P) MAC elements 515. The DSP slice targeting engine 412 may arrange the (N*P) MAC elements to operate in parallel. The code generator 408 may apply one or more optimizations to the (N*P) MAC elements added to the model 402. For example, in a first embodiment, the code generator 408 may replace the (N*P) MAC elements with a single, resource shared MAC element. In a second embodiment, the code generator 408 may stream the matrix inputs to one or more of the MAC elements.

In some implementations, the pattern recognizer 627 may search for and identify one or more complex multiply elements included in the model. A complex multiply element may be a multiply element in which at least one input is a complex number, e.g., has the form a+bi where a and b are real numbers and $i^2=-1$. In a first embodiment, the DSP slice targeting engine 412 may replace or lower a complex multiply element with four multiply elements and two add elements. In a second embodiment, the DSP slice targeting engine 412 may replace or lower a complex multiply element with two multiplier elements and two Multiply-Add elements 517.

Pattern matching may be target hardware dependent. For example, the pattern recognizer 627 may identify a pattern, but determine that the target hardware does not support the identified pattern. In some cases, the pattern recognizer 627 may alter a pattern identified in an IR so that the pattern, as altered, is supported by the target hardware. For example, the pattern recognizer 627 may move one or more elements of a pattern. For example, the pattern recognizer 627 may move a register that is between an adder and a multiplier to the output of the multiplier. The pattern, as altered, may then be supported by the target hardware.

Figure 19:
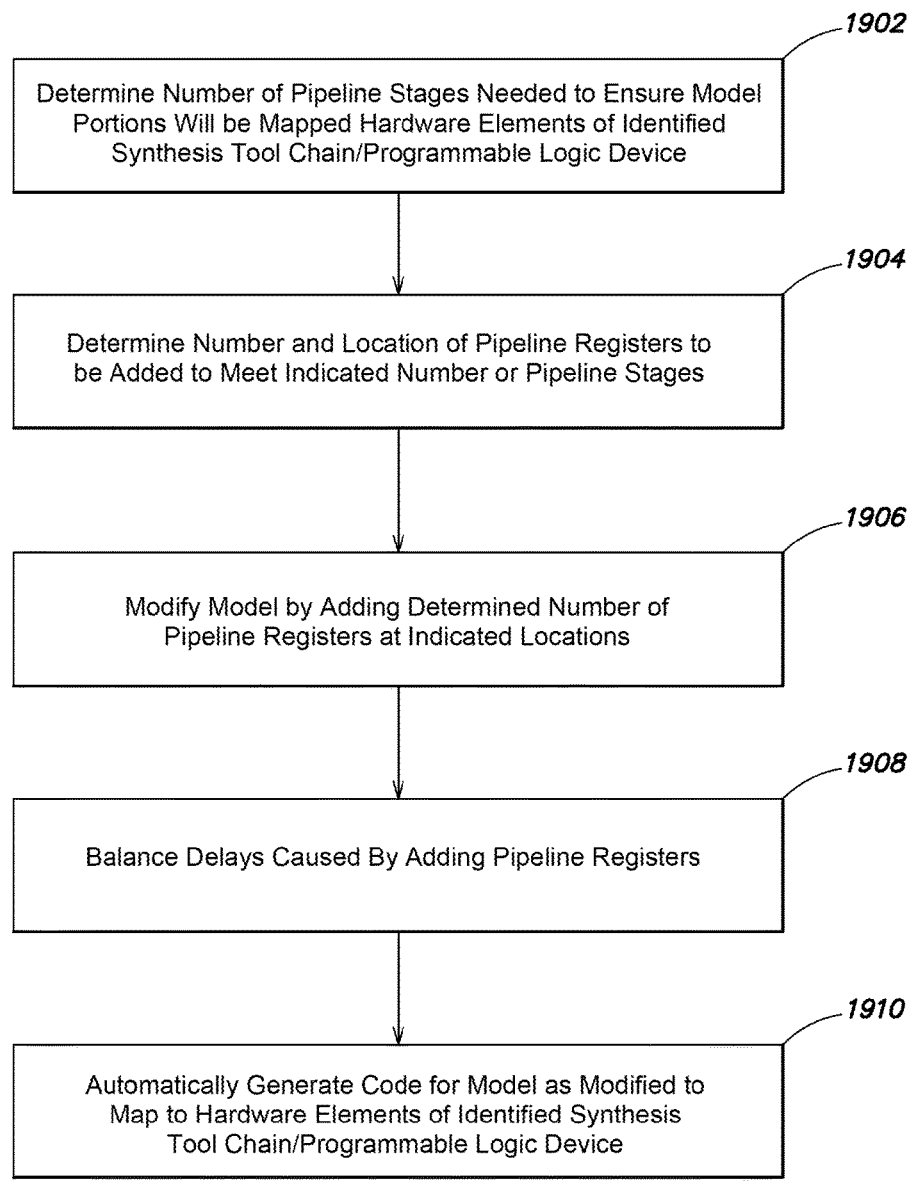
FIG. 19 is a flow diagram of an example method in accordance with an embodiment of the disclosure.

FIG. 19 is a flow diagram of a method in accordance with an embodiment. The DSP slice targeting engine 412 may determine whether one or more pipeline stages should be added, as indicated at step 1902. Suppose, for example, that the identified pattern includes a multiplier. The DSP slice targeting engine 412 may determine the word lengths (bit-widths) of the inputs to the multiplier. The DSP slice targeting engine 412 may perform a lookup on the target hardware characterization database 414 using the word lengths of the inputs to the multiplier and the clock speed to determine how many DSP slices of the target programmable logic device will be needed to implement the multiplier, and the number of pipeline stages to be added such that the multiplier is mapped to the indicated number of DSP slices. The DSP slice targeting engine 412 may also obtain the number of pipeline registers to be added and their location from the target hardware characterization database 414, as indicated at step 1904. The DSP slice targeting engine 412 may further modify the model (or one or more of the IRs) by adding the determined number of pipeline registers at the specified locations, as indicated at step 1906.

More specifically, while the identified pattern may resemble the structure of one or more DSP slices, it may not necessarily map to a DSP slice during hardware synthesis without modification. The DSP slice targeting engine 412 modifies the model (or one or more of the IRs), for example adding pipeline registers, rearranging multiplier and adder elements, etc., so that the portion of the IR adheres to the structure of the DSP slice of the target programmable logic device. That is, once modified, the portion of the model (or IR) accords with, coheres to, is coherent with, and/or corresponds to the structure of the DSP slice of the programmable logic device 508.

The addition of pipeline registers to meet the indicated pipeline depth may introduce delays or latencies into the model 402. The delay balancing engine 607 may determine whether one or more delays have been introduced into the model (or one or more of the IRs), and may balance the one or more delays, as indicated at step 1908. For example, the delay balancing engine 607 may traverse data and/or control paths of a model and sum the latencies or delays that have been introduced in the data and/or control paths, for example as a result of the addition of pipeline registers. At locations in the model where two or more data and/or control paths merge, e.g., a join point, the delay balancing engine 607 may compare the sum of delays on each path, and determine whether the sums being compared are equal. If the sums are not equal at all of the merging paths, the delay balancing engine 607 may insert one or more Delay elements into the path(s) whose sum is less than the other paths. The delay balancing engine 607 also may configure the one or more inserted Delay elements, for example with a delay value, so that the sum of delays of all of the merging paths is equal at the join point being evaluated. The one or more inserted Delay elements also may be configured to operate at the same rate as the other data and/or control, such as signals, at the join point being evaluated. This process may be repeated at other join points in the model to ensure that the data and/or control paths remain aligned, for example as specified in the original source model.

The code generator 408 may automatically generate code for the model as modified, as indicated at step 1910. For example, the IR for the model as modified may be subject to further transform operations by the IR generator 620, as part of the code generation process, ending with the creation of the final IR 626. The back-end processing unit 622 may utilize the final IR 626 to generate the HDL code 416. In some implementations, instead of (or in addition to) modifying one or more IRs, the code generator 408 may alter the generated code, such as HDL code, so that portions of the generated code map to hardware elements, such as DSP slices, of the programmable logic device.

In some embodiments, user access may be provided to the target hardware characterization database 414 and/or the hardware characterization database builder 700, for example through an Application Programming Interface (API). The API may allow a user to create a custom target hardware characterization database and modifying, adding and/or deleting entries, e.g., rows, from a target hardware characterization database. By modifying the information in the target hardware characterization database 414, a user may control how multipliers, Multiply-Add blocks, or other model elements are pipelined during code generation.

In other embodiments, a new model, such as a validation model, may be generated from one or more IRs, instead of (or in addition to) generating HDL code.

Figure 20:
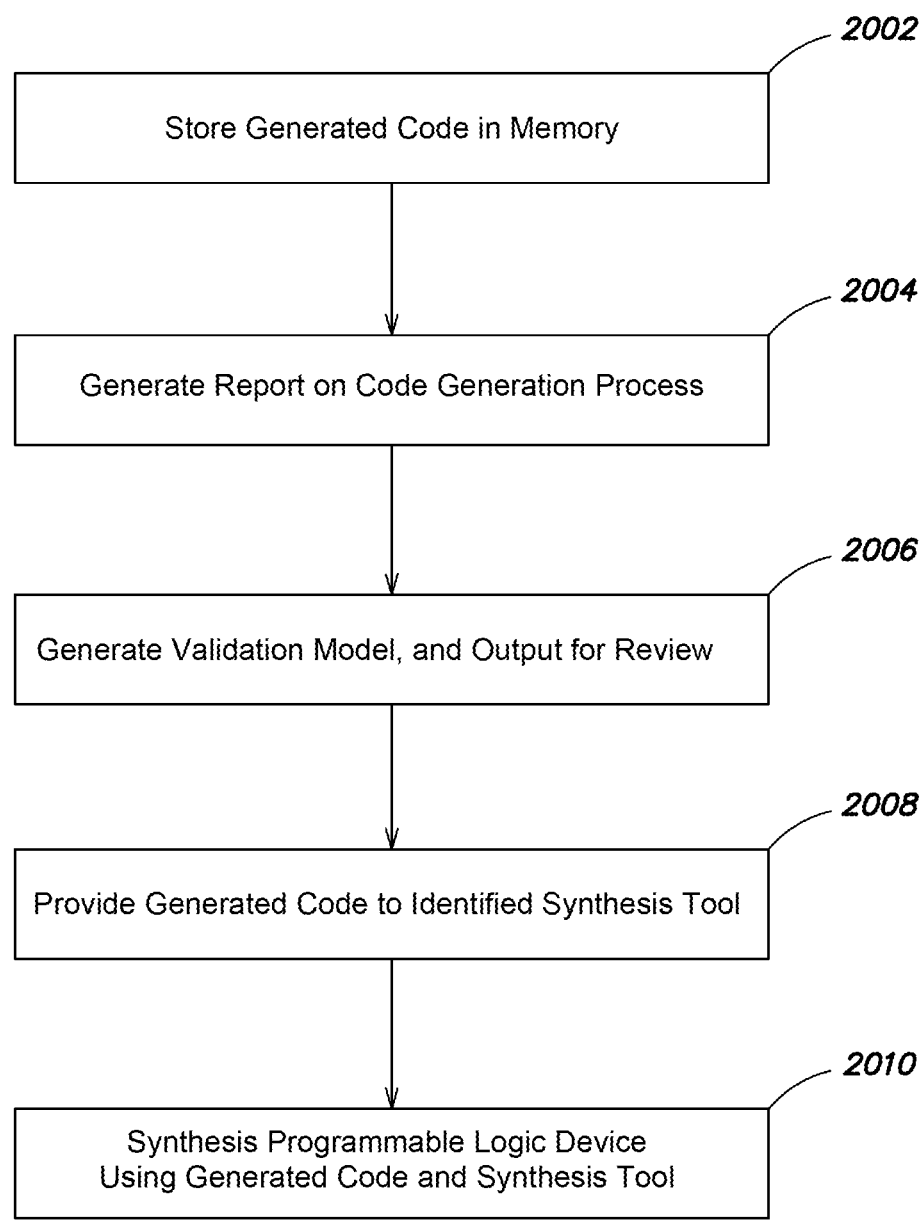
FIG. 20 is a flow diagram of another example method in accordance with an embodiment of the disclosure.

FIG. 20 is a flow diagram of a method in accordance with an embodiment. The code generator 408 may store the generated code in memory, as indicated at step 2002. The report generator 608 may generate a report, such as a hardware resource utilization report, on the code generation process, as indicated at step 2004. The report may be output, for example on a display device and/or a printer, for review by a user. In some embodiments, the report may include information produced by the synthesis tool chain 426. In other embodiments, the synthesis report generator 540 of the synthesis tool chain may produce one or more reports that may be output, e.g., on a display device or a printer.

In some implementations, the graphical model generator 608 may generate a validation model from one or more of the transitional IRs 624 and/or the final IR 626, as indicated at step 2006. The validation model may include model elements and connections as indicated by the transitional IRs 624 and/or the final IR 626, following the modifications by the DSP slice targeting engine 412, including model elements that correspond to the elements added by the code generator 408. For example, the validation model may include delay elements to indicate the addition of pipeline registers. The modeling environment 502 may output the validation model, as also indicated at step 2006. For example, the modeling environment 502 may present the validation model on a display device, may print a copy of the validation model, and/or may store the validation model in a file, a repository, or other data structure or container. The validation model may provide a visual indication to the user of the changes made to the source model 402, and the user may compare the validation model to the source model 402 to see what changes were made. In addition, the user may also execute the validation model to confirm that it has the same behavior as the source model 402.

The modeling environment 502 and/or the code generator 408 may provide the generated code, e.g., HDL code 416, to the identified synthesis tool chain, as indicated at step 2008. The synthesis tool chain 426 may configure a programmable logic device, such as the FPGA 100, using the generated HDL code, as indicated at step 2010. The synthesis process may involve a number of stages. For example, the synthesis tool 530 may convert the received HDL code 416 into a netlist file. The mapping tool 532 may map logic in the netlist file to hardware components available on the FPGA 100, such as the CLBs 104, DSP slices 106, and RAM blocks 108 (among other elements). The synthesis tool 530 and/or the mapping tool 532 may access the technology library 542 to select particular hardware components and hardware component implementations. The mapping tool 532 may produce a native circuit description (NCD) file. The place and route tool 534 may receive the NCD file and select fixed positions on the target programmable logic device 508 for the hardware components. The place and route tool 534 may also route required connections between the placed hardware components using the programmable logic device's routing channels. The place and route tool 534 may produce a revised NCD file. The programming file generator 536 may receive the revised NCD file from the place and route tool 534, and generate one or more files suitable for configuring the target programmable logic device 508, such as a bitstream file. The bitstream file may be used directly to configure the target programmable logic device 508. For example, the synthesis tool chain 426 may be connected to the target programmable logic device, and the bitstream may be downloaded to the target programmable logic device 508.

Model Element Types Directed to DSP Slices

Figure 22:
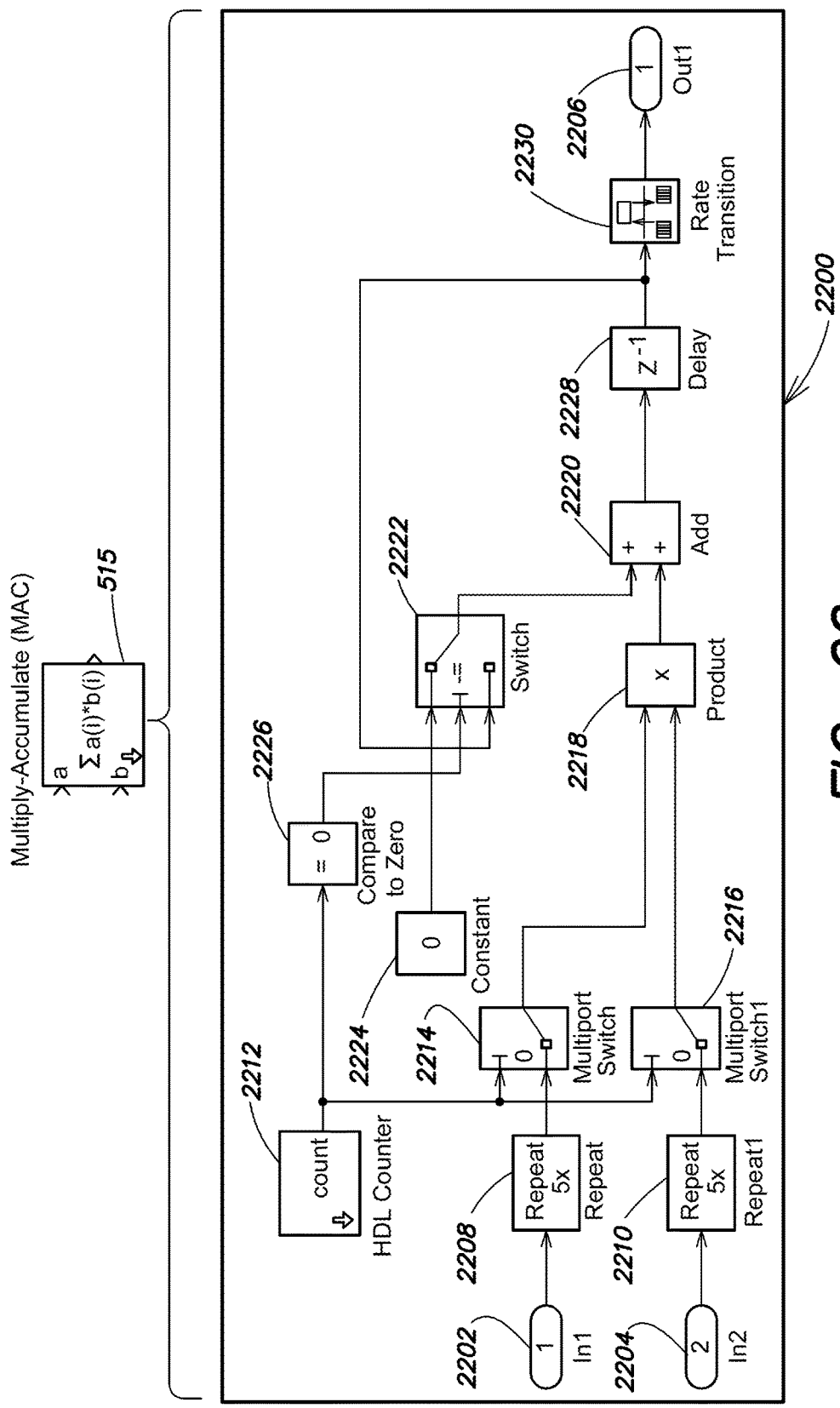
FIG. 22 is a schematic, example illustration of a model element in accordance with an embodiment of the disclosure.

FIG. 22 is a schematic illustration of the functionality of the Multiply-Accumulate (MAC) model element 515. The MAC model element 515 may be implemented as a subsystem 2200 of model elements. The subsystem 2200 may include two inport elements 2202, 2204 for receiving input values for a and b, and an output element 2206. The inport and outport model elements 2202, 2204, 2206 may correspond to respective input and output ports of the MAC element 515. The subsystem 2200 may additionally include two repeat elements 2208, 2210 that receive signals from the inport elements 2202, 2204. The repeat elements 2208, 2210 may upsample each channel of an M-element vector input to a rate L times higher than the input sample rate, by repeating each consecutive input sample L times at its output. The subsystem 2200 may further include an HDL counter element 2212 and two multiport switch elements 2214, 2216. The HDL counter element 2212 may model a free-running or count-limited hardware counter that supports signed and unsigned integer and fixed-point data types. The HDL counter element 2212 emits its value for the current sample time. The multiport switch elements 2214, 2216 may receive the output of the repeat elements 2208, 2210 as data signals, and the output of the HDL counter element 2212 as control signals. A multiport switch element, such as the multiport switch elements 2214, 2216 may output one of its data inputs as a function of the value of its control input.

The subsystem 2200 may further include a multiply model element (Product) 2218 and an adder model element (Add) 2220. Outputs of the multiport switch elements 2214, 2216 may be provided to the multiplier element 2218, and its output may be provided to the adder model element 2220. The subsystem 2200 may further include a switch model element 2222 that may receive a constant value from a constant model element 2224 as one of the switch's data inputs, and the output of a compare to zero model element 2226, as the switch's control input. The output of the HDL counter model element 2212 may also be provided to the compare to zero model element 2226. The output of the adder model element 2220 may be provided to a delay model element 2228 whose output may be provided to a rate transition model element 2230. The output of the rate transition model element 2230 may be provided to the outport model element 2206. The output of the delay model element 2228 may also be fed back to one of the inputs of the switch model element 2222.

Referring to FIG. 2, the DSP slice targeting engine 412 may map a MAC element 515 included in a model to the first 18×18 bit multiplier 208, the intermediate multiplexer 218, the accumulator 220, the adder 222, the output multiplexer 224, and the output register 226 of the 18-bit precision mode DSP block 200, as indicated by the first dashed line 230. A gain or multiply element of a model may be mapped to the 18×18 bit multipliers 208, 210 of the DSP block 200.

Referring to FIG. 3, the DSP slice targeting engine 412 may map a MAC element 515 included in a model to the 25×18 bit multiplier 310, the register 312, the Arithmetic Logic Unit (ALU) 316, the multiplexer 314, the equality check unit 318, and the output register 320 of the DSP48E1 slice 300, as indicated by the first dashed line 322. A gain or multiply element of a model may be mapped to the 25×18 bit multiplier 310 of the DSP48E1 slice 300.

Figure 23:
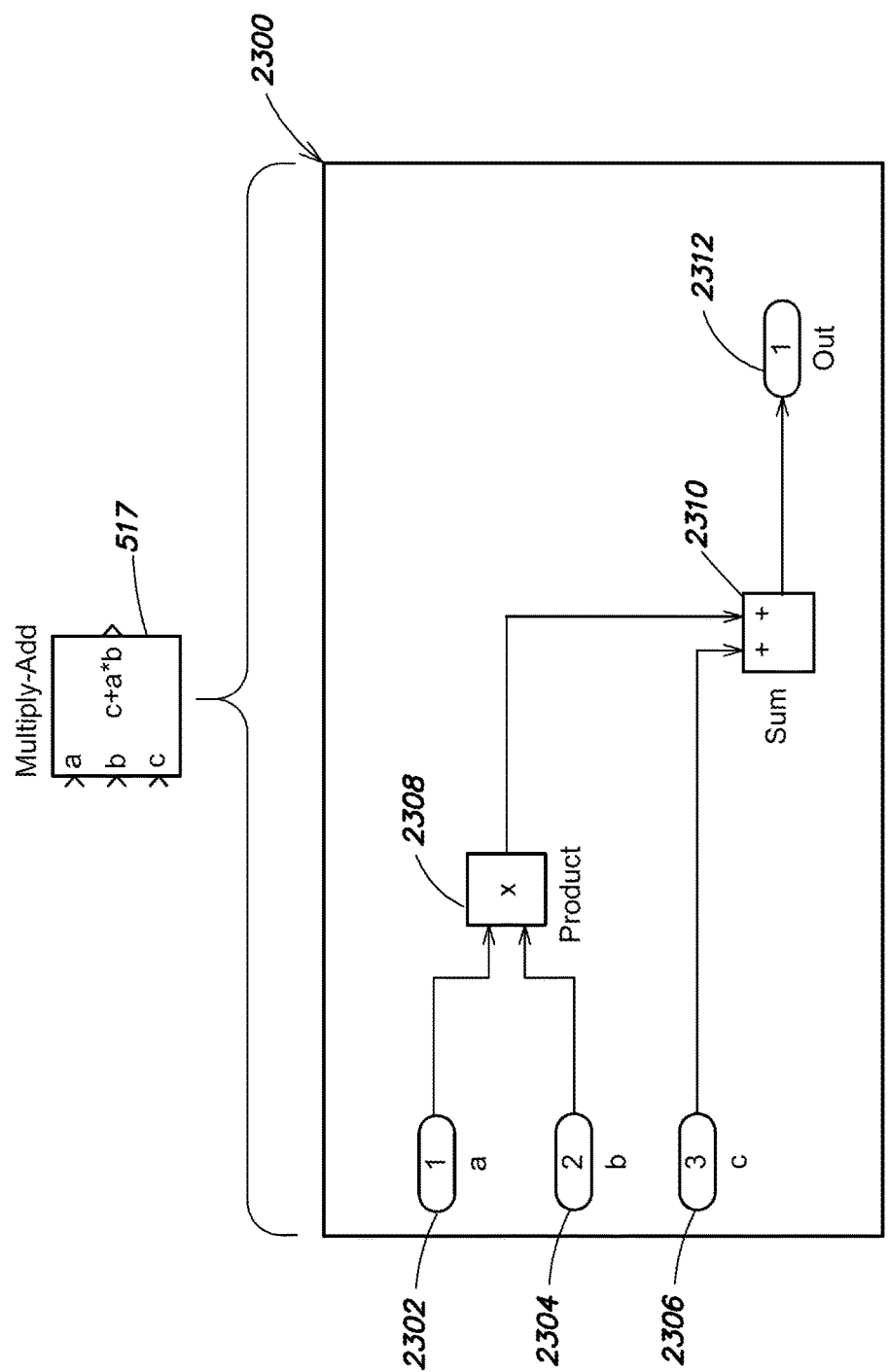
FIG. 23 is a schematic, example illustration of a model element in accordance with an embodiment of the disclosure.

FIG. 23 is a schematic illustration of the functionality of the Multiply-Add model element 517. The Multiply-Add model element 517 may be implemented as a subsystem 2300 of model elements. The subsystem 2300 may include three inport model elements 2302, 2304, 2306 for receiving input values for a, b, and c. The values from the inport model elements 2302, 2304 may be provided to a multiply model element 2308 whose output may be provided to an adder model element (Sum) 2310. The value from the inport model element 2306 may be provided as the second input to the adder model element 2310. The output of the adder model element 2310 may be provided to an output model element 2312 of the subsystem 2300.

Referring to FIG. 2, the DSP slice targeting engine 412 may map a Multiply-Add element 517 included in a model to the first 18×18 bit multiplier 208 and the adder 222, as indicated by the dashed line 232.

Referring to FIG. 3, the DSP slice targeting engine 412 may map a Multiply-Add element 517 included in a model to the 25×18 bit multiplier 310, the sixth register 312, and the Arithmetic Logic Unit (ALU) 316, as indicated by the dashed line 324.

Included in the source code listing attached as Appendix A are exemplary listings of generated HDL code for the MAC model element 515 and the Multiply-Add model element 517.

Mapping Model Portions to Memory Blocks

Figure 24:
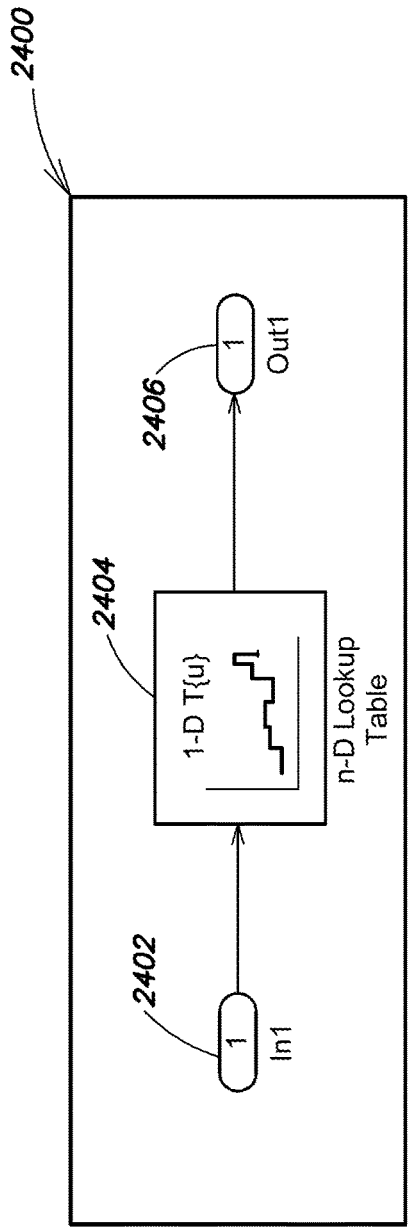
FIG. 24 is a schematic, example illustration of a model portion in accordance with an embodiment of the disclosure.
Figure 25:
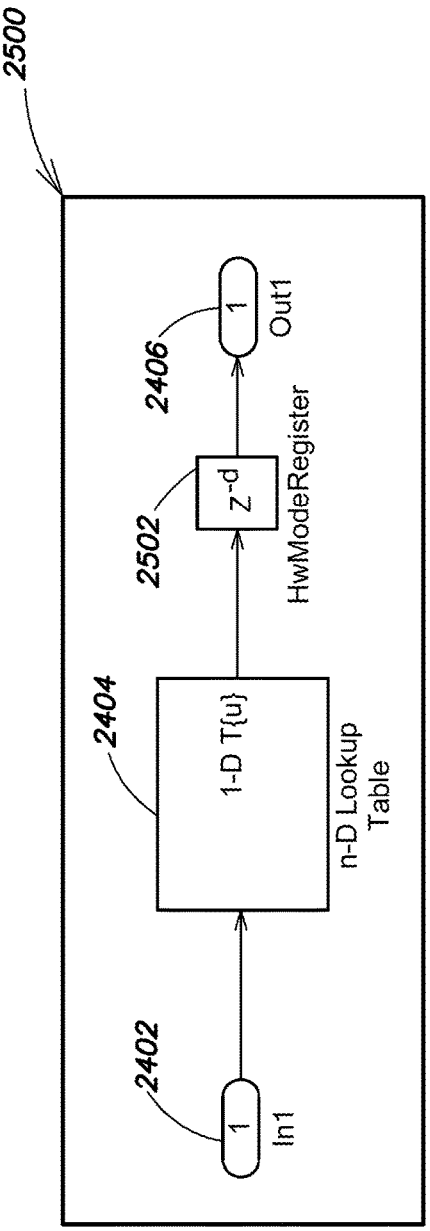
FIG. 25 is a schematic, example illustration of a modified model portion in accordance with an embodiment of the disclosure.

In some implementations, the code generator 408 may map one or more model elements to memory blocks of a programmable logic device, such as RAM or ROM blocks of an FPGA. FIG. 24 is a schematic illustration of a model portion 2400 that includes an Inport element 2402, an n-Dimension Lookup table element 2404, and an Outport element 2406. The n-Dimension Lookup table element 2404 may approximate an n-dimension function. To ensure that the model portion 2400 is mapped to a memory block of the programmable logic device to be synthesized, the code generator 408 may make one or more modifications to the model portion 2400. For example, the code generator 408 may add one or more registers that do not have hardware resets. FIG. 25 is a schematic illustration of a modified version 2500 of the model portion 2400. The code generator 408 inserts a register, which may be in the form of a delay element 2502, where the register does not include a reset. The delay element 2502 may be added to an output port of the n-Dimension Lookup table element 2404. When the code generator 408 generates code for the modified version 2500, Included in the source code listing attached as Appendix A is an exemplary listing of generated HDL code for a portion of a model that includes a lookup table element and a register that does not have a reset.

Illustrative Data Processing System

Figure 26:
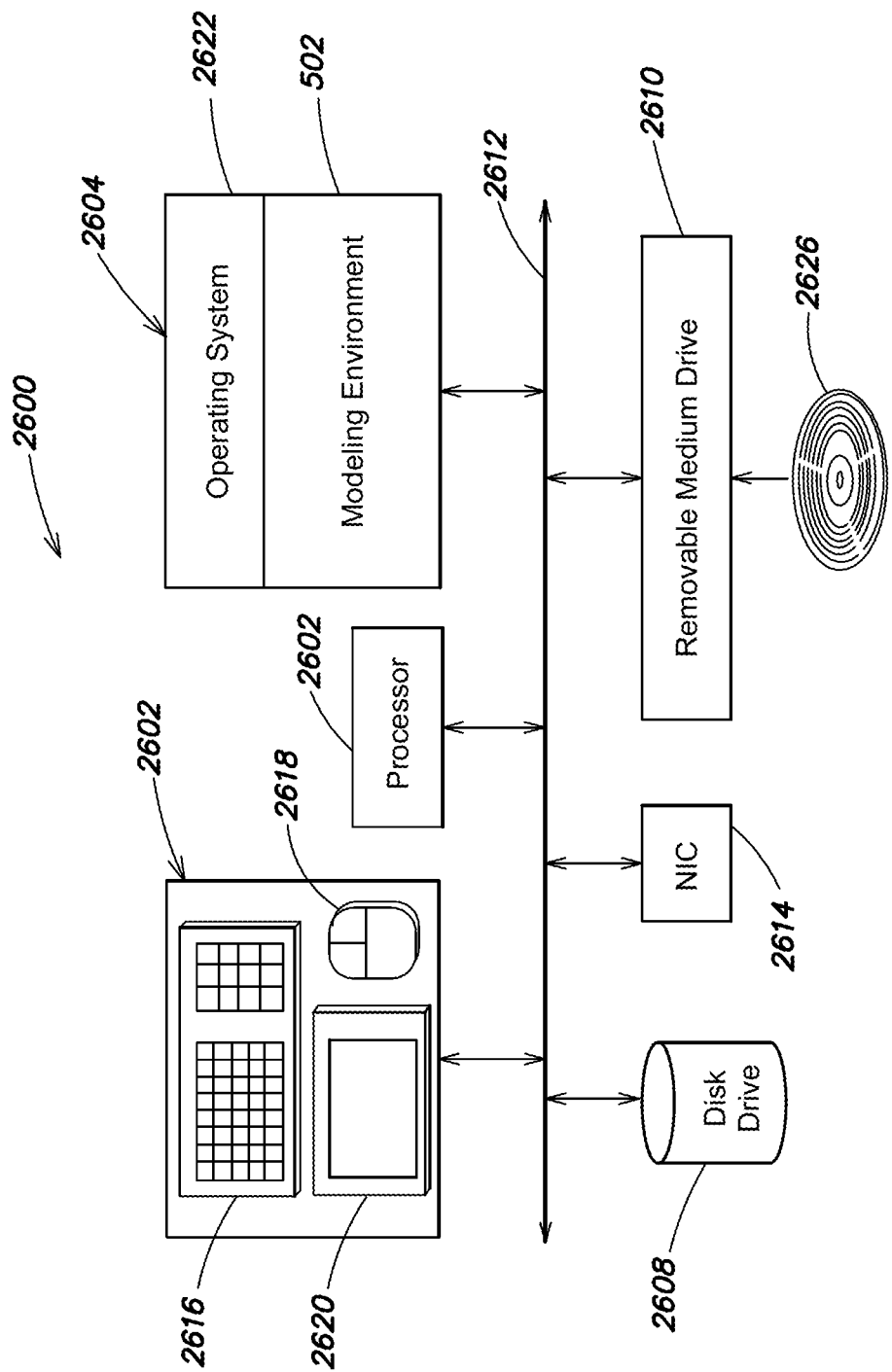
FIG. 26 is a schematic illustration of an example data processing system in accordance with an embodiment of the disclosure.

FIG. 26 is a schematic illustration of a computer or data processing system 2600 for implementing an embodiment of the invention. The computer system 2600 may include one or more processing elements, such as a processor 2602, a main memory 2604, user input/output (I/O) 2606, a persistent data storage unit, such as a disk drive 2608, and a removable medium drive 2610 that are interconnected by a system bus 2612. The computer system 2600 may also include a communication unit, such as a network interface card (NIC) 2614. The user I/O 2606 may include a keyboard 2616, a pointing device, such as a mouse 2618, and a display 2620. Other user I/O 2606 components include voice or speech command systems, touchpads and touchscreens, printers, projectors, etc. Exemplary processors include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 2604, which may be a Random Access Memory (RAM), may store a plurality of program libraries or modules, such as an operating system 2622, and one or more application programs that interface to the operating system 2622, such as the modeling environment 502.

The removable medium drive 2610 may accept and read a computer readable medium 2626, such as a CD, DVD, floppy disk, solid state drive, tape, flash memory or other non-transitory medium. The removable medium drive 2610 may also write to the computer readable medium 2626.

Suitable computer systems include personal computers (PCs), workstations, servers, laptops, tablets, palm computers, smart phones, electronic readers, and other portable computing devices, etc. Nonetheless, those skilled in the art will understand that the computer system 2600 of FIG. 26 is intended for illustrative purposes only, and that the present invention may be used with other computer, data processing, or computational systems or devices. The present invention may also be used in a computer network, e.g., client-server, architecture, or a public and/or private cloud computing arrangement. For example, the modeling environment 502 may be hosted on one or more cloud servers or devices, and accessed by remote clients through a web portal or an application hosting system, such as the Remote Desktop Connection tool from Microsoft Corp.

Suitable operating systems 2622 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 2622 may provide services or functions for applications or modules, such as allocating memory, organizing data objects or files according to a file system, prioritizing requests, managing I/O, etc. The operating system 2622 may run on a virtual machine, which may be provided by the data processing system 2600.

As indicated above, a user, such as an engineer, scientist, programmer, developer, etc., may utilize one or more input devices, such as the keyboard 2616, the mouse 2618, and the display 2620 to operate the modeling environment 502, and construct and revise one or more models. As discussed, the models may be computational and may have executable semantics. In particular, the models may be simulated or run. In particular, the models may provide one or more of time-based, event-based, state-based, message-based, frequency-based, control-flow based, and dataflow-based execution semantics. The execution of a model may simulate operation of the system that is being designed or evaluated. The term graphical model is intended to include graphical program.

Figure 27:
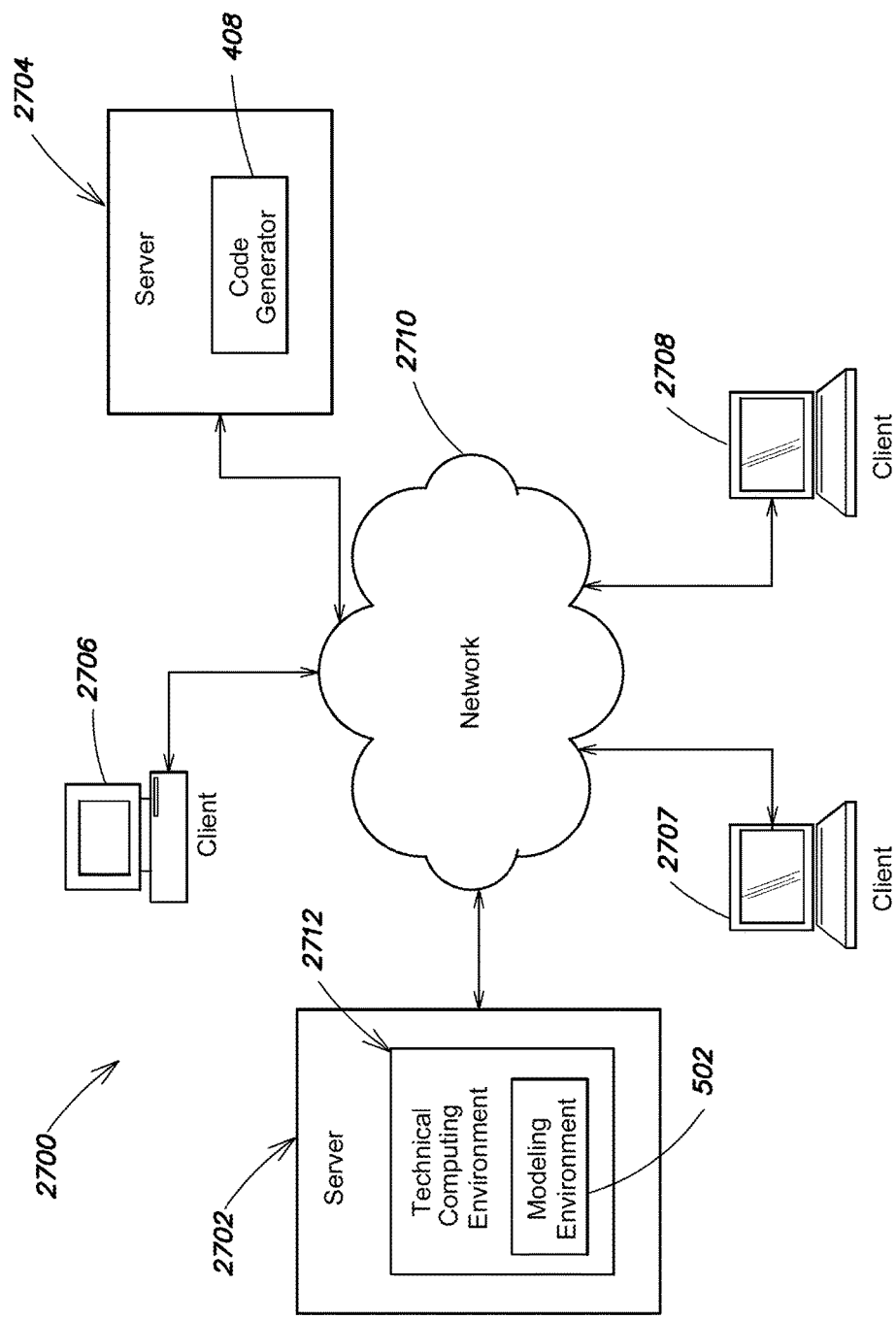
FIG. 27 is a schematic diagram of an example distributed environment in accordance with an embodiment of the disclosure.

FIG. 27 is a schematic diagram of an example distributed environment 2700 in which systems and/or methods described herein may be implemented. The environment 2700 may include client and server devices, such as two servers 2702 and 2704, and three clients 2706-2708, interconnected by one or more networks, such as network 2710. The servers 2702 and 2704 may include applications or processes accessible by the clients 2706-2708. For example, the server 2702 may include a technical computing environment (TCE) 2712, which may include or have access to a modeling environment, such as the modeling environment 502. The server 2704 may include a code generator, such as the code generator 408. The devices of the environment 2700 may interconnect via wired connections, wireless connections, or a combination of wired and wireless connections.

The servers 2702 and 2704 may include one or more devices capable of receiving, generating, storing, processing, executing, and/or providing information. For example, the servers 2702 and 2704 may include a computing device, such as a server, a desktop computer, a laptop computer, a tablet computer, a handheld computer, or a similar device. In some implementations, the servers 2702 and 2704 may host the TCE 2712, the modeling environment 502, and/or the code generator 408.

The clients 2706-2708 may be capable of receiving, generating, storing, processing, executing, and/or providing information. Information may include any type of machine-readable information having substantially any format that may be adapted for use, e.g., in one or more networks and/or with one or more devices. The information may include digital information and/or analog information. The information may further be packetized and/or non-packetized. In an embodiment, the clients 2706-2708 may download data and/or code from the servers 2702 and 2704 via the network 2710. In some implementations, the clients 2706-2708 may be desktop computers, workstations, laptop computers, tablet computers, handheld computers, mobile phones (e.g., smart phones, radiotelephones, etc.), electronic readers, or similar devices. In some implementations, the clients 2706-2708 may receive information from and/or transmit information to the servers 2702 and 2704.

The network 2710 may include one or more wired and/or wireless networks. For example, the network 2710 may include a cellular network, a public land mobile network ("PLMN"), a local area network ("LAN"), a wide area network ("WAN"), a metropolitan area network ("MAN"), a telephone network (e.g., the Public Switched Telephone Network ("PSTN")), an ad hoc network, an intranet, the Internet, a fiber optic-based network, and/or a combination of these or other types of networks. Information may be exchanged between network devices using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

The number of devices and/or networks shown in FIG. 27 is provided as an example. In practice, there may be additional devices and/or networks, fewer devices and/or networks, different devices and/or networks, or differently arranged devices and/or networks than those shown in FIG. 27. Furthermore, two or more devices shown in FIG. 27 may be implemented within a single device, or a single device shown in FIG. 27 may be implemented as multiple, distributed devices. Additionally, one or more of the devices of the environment 2700 may perform one or more functions described as being performed by another one or more devices of the environment 2700.

In some implementations, compiling a model may include determining a manner in which the set of model elements, e.g., blocks, included in the model, are connected (e.g., which outputs are connected to which inputs), determining characteristics associated with connections and/or model elements included in the model (e.g., a data type, a dimensionality, a complexity, etc.), assigning memory locations to particular model elements and/or connections, and/or designating an order in which the set of blocks are going to be executed (e.g., scheduling the model based on semantic rules, such as a synchronous data flow rule, a dynamic data flow rule, a Boolean data flow rule, a Kahn process network rule, a Petri net rule, a discrete event system rule, etc.). Additionally, or alternatively, compiling the model may include generating one or more execution lists associated with the model, determining computations that are actually going to be executed, determining a buffer allocation and/or allocating buffer space associated with model execution (e.g., determining and/or allocating a number and/or size of data buffers for the blocks and/or connections), determining time delays associated with the set of model elements, determining memory consumption and/or memory accesses associated with the set of model elements, and/or determining other information relating to size, performance, or ordering of the set of blocks included in the model.

In some implementations, compiling a model may include assigning a sample time to at least one model element (e.g., each model element) included in the model. For example, a client, e.g., client 2706 may assign a sample time to each model element of the set of model elements included in the model. In some implementations, client 2706 may assign the sample times based on sample time propagation rules associated with TCE 2712 and/or the modeling environment 502. For example, client 2706 may implement a set of propagation rules associated with TCE 2712 in order to assign a sample time to each model element included in the model. In some implementations, a model element may be assigned a sample time that corresponds to the sample time identifier associated with the model element. Alternatively, the model element may be assigned a sample time different than the sample time that corresponds to the sample time identifier (e.g., when the propagation rules cause the different sample time to be assigned to the model element).

Additionally, or alternatively, compiling a model may include assigning model elements to computational resources for execution and/or setting a rate at which model elements in the model are to execute. Additionally, or alternatively, compiling the model may include determining static scheduling information associated with the model. For example, a client, such as client 2706 may analyze the model (e.g., based on rate monotonic scheduling (RMS), based on output dependencies associated with the model) in order to determine static scheduling information associated with the model. In some implementations, the static scheduling information may be used, during execution of the model, in order to determine an order associated with re-executing the one or more parameter sample time model elements. Additionally, or alternatively, compiling the model may include generating program code for executing the model. The program code may include program code describing the set of model elements included in the model. Additionally, or alternatively, the program code may include instructions for multi-rate execution (e.g., with different model elements being executed at different rates) and/or multi-task execution (e.g., with different model elements being executed using different computational resources) of the model. In some implementations, client 2706 may store the program code for later execution.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 2600. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. For example, in some implementations one or more portions of a model may be designated for deterministic mapping to DSP slices or other hardware elements. For example, a setting may be used for a subsystem, submodel, component, or other portion of a model to indicate whether the portion of the model should be searched for elements that may be mapped to one or more DSP slices or other hardware elements. The setting may be a parameter or property that is user-settable, for example through a properties page or dialog associated with the model portion. Therefore, it is the object of the appended claims to cover all such variations and modifications as come within the true spirit and scope of the disclosure.

What is claimed is:

1. A method comprising:
   for an executable, behavioral model including model elements, two or more of the model elements configured to exchange signals, data, control, events, or messages, and the executable, behavioral model, when executed, simulating a system,
   identifying one or more of the model elements for mapping to one or more DSP slices of a programmable logic device, the one or more DSP slices including a plurality of hardware elements arranged in a structure;
   retrieving, from one or more databases, information for mapping the one or more of the model elements to the structure of the one or more DSP slices of the programmable logic device;
   automatically modifying, by a processor, an in-memory representation of the executable, behavioral model to map to the structure of the one or more DSP slices of the programmable logic device; and
   generating code for the modified in-memory representation of the executable, behavioral model, where the generated code maps, during hardware synthesis, to the one or more DSP slices of the programmable logic device.

2. The method of claim 1 wherein the one or more of the model elements includes at least one of
   a multiply element,
   a gain element,
   a product element,
   an add element,
   a multiply-accumulate element,
   a multiply-add element, or
   a multiply element followed by an add element.

3. The method of claim 1 wherein the automatically modifying an in-memory representation of the executable, behavioral model includes adding one or more pipeline registers to the in-memory representation of the executable behavioral model.

4. The method of claim 3 wherein the number of the one or more pipeline registers added to the in-memory representation of the executable, behavioral model is a function of a type of hardware synthesis tool.

5. The method of claim 1 wherein the in-memory representation of the executable, behavioral model is modified to conform to a characteristic of the programmable logic device.

6. The method of claim 1 further comprising:
   receiving a design clock speed for the code; and
   performing a lookup on one or more of the one or more databases using the received design clock speed.

7. The method of claim 6 further comprising:
   retrieving, from the one or more of the one or more databases, in response to the lookup, a number of pipeline registers, wherein the automatically modifying an in-memory representation of the executable, behavioral model includes adding the number of pipeline registers to the in-memory representation of the executable, behavioral model.

8. The method of claim 1 wherein the one or more of the model elements includes a multiplier, and the multiplier includes a first input with a first input bitwidth and a second input with a second input bitwidth, the method further comprising:
   performing a lookup on one or more of the one or more databases using the first input bitwidth and the second input bitwidth.

9. The method of claim 1 wherein the generated code is Hardware Description Language (HDL) code.

10. The method of claim 1 wherein the programmable logic device includes a Field Programmable Gate Array (FPGA).

11. The method of claim 1 wherein the one or more of the model elements included in the executable, behavioral model implements a multiply-accumulate (MAC) function.

12. The method of claim 1 wherein the one or more of the model elements included in the executable, behavioral model implements a multiply-add function.

13. The method of claim 1 wherein the in-memory representation of the executable behavioral model is the executable behavioral model or an intermediate representation of the executable, behavioral model.

14. The method of claim 1 wherein the programmable logic device includes memory blocks, the automatically modifying maps a first model element to one or more of the memory blocks of the programmable logic device.

15. One or more non-transitory computer-readable media, having stored thereon, instructions that when executed by a computing device, cause the computing device to perform operations comprising:
   for an executable, behavioral model including model elements, two or more of the model elements configured to exchange signals, data, control, events, or messages, and the executable, behavioral model, when executed, simulating a system,
   identifying one or more of the model elements for mapping to one or more DSP slices of a programmable logic device, the one or more DSP slices including a plurality of hardware elements arranged in a structure;
   retrieving, from one or more databases, information for mapping the one or more of the model elements to the structure of the one or more DSP slices of the programmable logic device;
   automatically modifying, by a processor, an in-memory representation of the executable, behavioral model to map to the structure of the one or more DSP slices of the programmable logic device; and generating code for the modified in-memory representation of the executable, behavioral model, where the generated code maps, during hardware synthesis, to the one or more DSP slices of the programmable logic device.

16. The one or more non-transitory computer-readable media of claim 15 wherein the automatically modifying includes adding one or more elements representing pipeline registers to the in-memory representation.

17. The one or more non-transitory computer-readable media of claim 16 wherein the number of the one or more elements representing pipeline registers is a function of at least one of
the programmable logic device,
a type of synthesis tool, or
a clock speed of the programmable logic device.

18. The one or more non-transitory computer-readable media of claim 15 wherein the one or more of the model elements includes at least one of
a multiply element,
a gain element,
a product element,
an add element,
a multiply-accumulate element,
a multiply-add element, or
a multiply element followed by an add element.

19. The one or more non-transitory computer-readable media of claim 15 wherein the programmable logic device includes memory blocks, the automatically modifying maps a first element of the in-memory representation to one or more of the memory blocks of the programmable logic device.

20. An apparatus comprising:
a memory; and
one or more processors coupled to the memory, the one or more processors configured to:
identify one or more of model elements of an executable, behavioral model stored in the memory for mapping to one or more DSP slices of a programmable logic device, the one or more DSP slices including a plurality of hardware elements arranged in a structure;
retrieve, from one or more databases, information for mapping the one or more model elements to the structure of the one or more DSP slices of the programmable logic device,
modify an in-memory representation of the executable, behavioral model to map to the structure of the one or more DSP slices of the programmable logic device; and
generate code for the modified in-memory representation of the executable, behavioral model, where the generated code maps, during hardware synthesis, to the one or more DSP slices of the programmable logic device.

21. The apparatus of claim 20 wherein the modify an in-memory representation of the executable, behavioral model includes adding one or more pipeline registers to the in-memory representation of the executable, behavioral model.

22. The apparatus of claim 20 wherein the one or more processors are further configured to:
receive a design clock speed for the code; and
perform a lookup on one or more of the one or more databases using the received design clock speed.

23. The apparatus of claim 22 wherein the one or more processors are further configured to:
retrieve, from the one or more of the one or more databases, in response to the lookup, a number of pipeline registers, wherein the modify an in-memory representation of the executable, behavioral model includes adding the number of pipeline registers to the in-memory representation of the executable, behavioral model.

24. The apparatus of claim 20 wherein the one or more of the model elements includes a multiplier, and the multiplier includes a first input with a first input bitwidth and a second input with a second input bitwidth, the one or more processors further configured to:
perform a lookup on one or more of the one or more databases using the first input bitwidth and the second input bitwidth.

* * * * *

UNITED STATES PATENT AND TRADEMARK OFFICE
CERTIFICATE OF CORRECTION

PATENT NO. : 10,114,917 B1
APPLICATION NO. : 15/225193
DATED : October 30, 2018
INVENTOR(S) : Girish Venkataramani et al.

Page 1 of 1

It is certified that error appears in the above-identified patent and that said Letters Patent is hereby corrected as shown below:

In the Claims
Column 35, Line 39 reads:
"Identify one or more of model elements of an executable,"
Should read:
--Identify one or more model elements of an executable,--

Signed and Sealed this
Twenty-seventh Day of August, 2019

Andrei Iancu
*Director of the United States Patent and Trademark Office*